(12) United States Patent
Takeuchi

(10) Patent No.: US 9,485,919 B2
(45) Date of Patent: Nov. 8, 2016

(54) MULTICOLOR LIGHT EMITTING DIODE LAMP FOR PLANT GROWTH, ILLUMINATION APPARATUS, AND PLANT GROWTH METHOD

(75) Inventor: Ryouichi Takeuchi, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 130 days.

(21) Appl. No.: 13/388,796

(22) PCT Filed: Aug. 5, 2010

(86) PCT No.: PCT/JP2010/063297
§ 371 (c)(1),
(2), (4) Date: Feb. 3, 2012

(87) PCT Pub. No.: WO2011/016521
PCT Pub. Date: Feb. 10, 2011

(65) Prior Publication Data
US 2012/0124903 A1    May 24, 2012

(30) Foreign Application Priority Data
Aug. 7, 2009    (JP) .................. 2009-184569

(51) Int. Cl.
*A01G 7/04*    (2006.01)
*F21Y 101/02*    (2006.01)
(Continued)

(52) U.S. Cl.
CPC .............. *A01G 7/045* (2013.01); *A01G 7/04* (2013.01); *F21Y 2101/02* (2013.01);
(Continued)

(58) Field of Classification Search
CPC ................................ A01G 7/00; A01G 7/045

USPC .................. 362/231, 23, 367, 157, 84, 608, 362/543–545, 293, 227; 47/58; 257/100, 257/103, 79
See application file for complete search history.

(56) References Cited

U.S. PATENT DOCUMENTS 4,814,667 A * 3/1989 Tanaka .......................... 313/500
5,012,609 A    5/1991 Ignatius et al.
(Continued)

FOREIGN PATENT DOCUMENTS

CN    2438321 Y    7/2001
CN    102414847 A    4/2012
(Continued)

OTHER PUBLICATIONS

International Search Report for PCT/JP2010/063297 filed Dec. 7, 2010.
(Continued)

*Primary Examiner* — Jong-Suk (James) Lee
*Assistant Examiner* — Zheng Song
(74) *Attorney, Agent, or Firm* — Sughrue Mion, PLLC

(57) ABSTRACT

A multicolor light emitting diode lamp includes a blue LED and a AlGaInP-based red LED having high luminescence efficiency, balancing with the blue LED are mounted in the same package. The red LED includes a light emitting section including a light emitting layer having a composition formula, $(Al_XGa_{1-X})_YIn_{1-Y}P$ ($0 \leq X \leq 1$ and $0 < Y \leq 1$). The red LED emits at least as many photons as the blue LED when the same electric current is flowed. When a strong red light is desirable for plant growth, by mounting two red LEDs and one blue LED, a desired mixed color is obtained with one lamp, and irradiation of light can be made uniform.

10 Claims, 10 Drawing Sheets

(51) Int. Cl.
*F21Y 113/00* (2016.01)
*H01L 25/075* (2006.01)

(52) U.S. Cl.
CPC .... *F21Y 2113/002* (2013.01); *F21Y 2113/005* (2013.01); *H01L 25/0753* (2013.01); *H01L 2224/45144* (2013.01); *H01L 2224/49175* (2013.01); *Y02P 60/149* (2015.11)

(56) References Cited

U.S. PATENT DOCUMENTS

| | | | | |
|---|---|---|---|---|
| 7,081,708 | B2* | 7/2006 | Ito et al. | 315/82 |
| 2001/0046136 | A1* | 11/2001 | Weber et al. | 362/494 |
| 2001/0048598 | A1* | 12/2001 | Fang et al. | 362/231 |
| 2006/0262530 | A1* | 11/2006 | Sakai et al. | 362/231 |
| 2007/0001188 | A1 | 1/2007 | Lee | |
| 2007/0058368 | A1* | 3/2007 | Partee et al. | 362/231 |
| 2008/0042151 | A1* | 2/2008 | Oh | H01L 25/0753 257/88 |
| 2008/0054280 | A1 | 3/2008 | Reginelli et al. | |
| 2008/0297644 | A1* | 12/2008 | Farchtchian | H01L 25/0753 348/340 |
| 2009/0080185 | A1* | 3/2009 | McMillan | 362/231 |
| 2009/0288340 | A1* | 11/2009 | Hess | 47/58.1 LS |
| 2010/0006818 | A1 | 1/2010 | Matsumura | |
| 2010/0020536 | A1* | 1/2010 | Bafetti et al. | 362/231 |
| 2010/0039804 | A1* | 2/2010 | Budde et al. | 362/231 |
| 2011/0209400 | A1* | 9/2011 | Rooymans | 47/17 |

FOREIGN PATENT DOCUMENTS

| | | |
|---|---|---|
| DE | 202004011869 U1 | 11/2005 |
| DE | 202004011869 U1 | 12/2005 |
| JP | 2000-275636 A | 10/2000 |
| JP | 8-103167 A | 4/2001 |
| JP | 2001-86860 A | 4/2001 |
| JP | 2002-27831 A | 1/2002 |
| JP | 2007-214225 A | 8/2007 |
| JP | 2009-125007 A | 6/2009 |
| JP | 2010-239098 A | 10/2010 |
| WO | WO 2008/099699 A1 | 8/2008 |

OTHER PUBLICATIONS

Chinese Office Action (First Office Action) with a mailing date of Mar. 5, 2013 for corresponding Chinese Patent Application No. 201080044426.7.

Communication dated Apr. 24, 2015 from the European Patent Office in counterpart application No. 10806520.2.

* cited by examiner

MULTICOLOR LIGHT EMITTING DIODE LAMP FOR PLANT GROWTH, ILLUMINATION APPARATUS, AND PLANT GROWTH METHOD

CROSS REFERENCE TO RELATED APPLICATIONS

This application is a National Stage of International Application No. PCT/JP2010/063297 filed on Aug. 5, 2010, which claims priority from Japanese Patent Application No. 2009-184569, filed on Aug. 7, 2009, the contents of all of which are incorporated herein by reference in their entirety.

TECHNICAL FIELD

The present invention relates to a multicolor light emitting diode lamp for plant growth, an illumination apparatus, and a plant growth method.

Priority is claimed on Japanese Patent Application No. 2009-184569, filed Aug. 7, 2009, the content of which is incorporated herein by reference.

BACKGROUND ART

In recent years, plant growth using an artificial light source has been studied. In particular, attention is being paid to a cultivation method using an illumination by a light emitting diode (LED) which has excellent monochromaticity and in which energy saving, long service life, and a reduction in size are possible.

From previous study results, as one luminescence wavelength suitable for a light source for plant growth (photosynthesis), the effects of blue light having a wavelength around 450 nm and red light having a wavelength range of 600 nm to 700 nm have been confirmed. In particular, with respect to photosynthesis, light having a wavelength of around 660 nm to 670 nm is the most desirable light source having high reaction efficiency.

In plant cultivation, a photosynthetically effective photon flux density is used as light intensity. The photosynthetically effective photon flux density represents the number of photons per unit time and area, of light in a visible light region effective for photosynthesis. Red and blue light is light in a visible light region effective for photosynthesis.

The light intensity of a light source for plant growth is evaluated by the number of photons, namely the photon flux (μmol/s). Moreover, the light intensity of the irradiation surface corresponding to the performance of an illumination apparatus is evaluated by the photon flux density (μmol/s·m$^2$) which is the incident photon flux per unit area of the irradiation surface.

Moreover, the balance in the light intensities of red and blue light is known to be an important factor to the growth of plants. Specifically, it is preferable that for many plants, though it depends on the kind of plant, red and blue photons are balanced such that red photons are several times (for example, 2 to 10 times) stronger than blue photons.

In the conventional light emitting diode lamp, in order to irradiate plants with blue and red light with an equal intensity ratio, a method of disposing a plurality of red lamps and a plurality of blue lamps in a mixed manner, a method of controlling light distribution, the production of a light emitting diode including a light emitting layer that emits red and blue light, and the like have been studied (for example, see PTLs 1 to 3).

However, although $Al_xGa_{1-x}As$ is used in the light emitting layer of the conventional red LED, since the luminescence efficiency of the red LED is lower than that of the blue LED, it is desirable to improve the luminescence efficiency of the red LED. Moreover, when using a red LED having low luminescence efficiency, in order to obtain a desirable mixed color light ideal for plant growth, a number of red LEDs are required for one blue LED. Thus, since the number of red lamps is different from the number of blue lamps, a large number of red LEDs are interspersed around the blue LEDs, and it is difficult to irradiate the mixed color light uniformly. Moreover, in order to irradiate the mixed color light uniformly, it is necessary to light all the LEDs in units of blocks in which the blue LED is used as a control factor.

In contrast, as a LED having high luminescence efficiency, a LED including a light emitting layer made of aluminum gallium indium phosphide (composition formula: $(Al_xGa_{1-x})_YIn_{1-Y}P$ ($0 \leq X \leq 1$ and $0 < Y \leq 1$)) is known. However, in the LED including the light emitting layer, a light emitting layer having a composition of $Ga_{0.5}In_{0.5}P$ has the longest wavelength, and its peak wavelength is around 650 nm. In a wavelength region longer than 655 nm, it is difficult to attain practical realization and obtain a high output. Thus, there is a problem in that the light emitting layer having the light emitting layer is not ideal for a light source for plant growth.

[PTL 1] Japanese Unexamined Patent Application Publication No. 8-103167
[PTL 2] Japanese Unexamined Patent Application Publication No. 2001-86860
[PTL 3] Japanese Unexamined Patent Application Publication No. 2002-27831

SUMMARY OF INVENTION

As for a light source of an illumination apparatus for plant growth, it is important to irradiate blue and red light uniformly with an optimum balance in accordance with the growth of plants. Moreover, from the perspective of energy saving, it is preferable not to irradiate light having low efficiency. Furthermore, it is preferable that the number of red photon fluxes is greater than the number of blue photon fluxes. As a result, it is preferable that the red photon flux density on an irradiation surface is larger than the blue photon flux density. It is preferable that the ratio of the red photon flux density to the blue photon flux density is uniform on the irradiation surface. The photon flux of a light emitting diode including the conventional AlGaAs-based light emitting layer was smaller than the photon flux of a blue light emitting diode. In this way, in order to realize an optimum light source for plant growth, since a small number of blue light emitting diodes are interspersed among a large number red light emitting diodes, it was difficult to irradiate blue and red light uniformly. For example, a technique of optimizing the orientation characteristics and the arrangement of lamps has been invented as disclosed in PTL 2. It is preferable to decrease the distance between a light source and plants to as small as possible in order to utilize light and space efficiently. However, in the technique disclosed in PTL 2, there is a problem in that it is difficult to irradiate blue and red light uniformly. Moreover, it is necessary to package the red and blue LEDs individually.

On the other hand, from the perspective of energy saving and cost, it is necessary to decrease power consumption and the number of LEDs used by using a green LED having high luminescence efficiency. In particular, in order to put an LED illumination for plant growth into practical use, it is strongly preferable to realize low power consumption, a compact size, and cost-down. In relation to an AlGaAs-based LED which is the conventional light emitting diode having a wavelength band of 660 nm, it is preferable to improve luminescence properties in a way of achieving higher output and higher efficiency.

Moreover, by the recent studies, it was confirmed that energy saving can be realized by turning off an illumination apparatus for plant growth during a photosynthic reaction after irradiating light. As for a lighting method, a technique of decreasing power consumption using high-speed pulses and alternating current is also studied. In this way, it is possible to take advantage of a light emitting diode having a fast response. However, in order to uniformly irradiate plants with blue and red light, in an illumination apparatus where blue LEDs are interspersed, since red and blue lamps are packaged individually, and the number and the arrangement of the lamps are irregular, a complicated lighting circuit is required in order to optimally control the lighting time and the electric current. Thus, there is a problem in that a sophisticated technique and an expensive lighting apparatus are required, which increases the cost. Moreover, there is a problem in that it is not possible to save space.

The present invention has been made in view of the above-mentioned circumstances and has an object to provide a multicolor light emitting diode lamp for plant growth, an illumination apparatus, and a plant growth method, which realize a high output and high efficiency, which do not require a complicated lighting circuit, and which are capable of irradiating blue and red light uniformly with the optimum balance even when the distance between a light source and plants is very small.

In order to solve the problems, the present inventor has studied intensively, and as the result of the studies, has noticed that a uniformly mixed color light was obtained when blue and red light emitting elements were simultaneously mounted in the same package, which was not conventionally practically used. Moreover, the present inventor has found that the blue and red light emitting diodes can be mounted in the same package by using a red light emitting diode having at least as many photon fluxes as a blue light emitting diode. Furthermore, the present inventor has studied a light emitting layer having a wavelength of 660 nm ideal for plant growth, made of $(Al_XGa_{1-X})_YIn_{1-Y}P$ ($0 \leq X \leq 1$ and $0 < Y \leq 1$) as a red LED having high luminescence efficiency, and as the result of the studies, has found that a light intensity at least as strong as the blue LED was obtained. The present inventor has invented an invention in which the red LED and the blue LED are simultaneously mounted in the same small-size package.

In addition, it was confirmed that a light emitting diode having an AlGaInP-based light emitting layer has a luminescence output that is three or more times that of an LED having an AlGaAs-based light emitting layer in a wavelength range of 660 nm. Thus, the present inventor has invented a multicolor light emitting diode lamp (package) ideal for plant growth using the light emitting diode. Furthermore, since uniform light of mixed color of blue and red is generated in a small-size package, the present inventor has discovered an illumination apparatus and a plant growth method, which is ideal for energy saving, and which is capable of controlling the package independently.

That is, the present invention relates to the following.

[1] A multicolor light emitting diode lamp for plant growth including: a first light emitting diode including a pn-junction type light emitting section having a light emitting layer which has a composition formula, $(Al_XGa_{1-X})_Y In_{1-Y}P$ ($0 \leq X \leq 0.1$ and $0 < Y \leq 1$), and in which a peak luminescence wavelength is not less than 655 nm and not more than 675 nm; and a second light emitting diode including a light emitting layer which has a composition formula, $Ga_XIn_{1-X}N$ ($0 \leq X \leq 1$) and in which a peak luminescence wavelength is not less than 420 nm and not more than 470 nm, wherein one or more of the first light emitting diodes and one or more of the second light emitting diodes are mounted on the same package, and wherein a photon flux R [μmol·s$^{-1}$] of the one or more of the first light emitting diodes and a photon flux B [μmol·s$^{-1}$] of the one or more of the second light emitting diodes mounted on the multicolor light emitting diode lamp satisfy a relation of R>B using the same electric current.

[2] The multicolor light emitting diode lamp for plant growth according to [1], wherein the number of first light emitting diodes mounted is greater than the number of second light emitting diodes mounted.

[3] The multicolor light emitting diode lamp for plant growth according to [1] or [2], wherein the distance between two adjacent light emitting diodes of the first and second light emitting diodes is within 10 mm.

[4] An illumination apparatus for plant growth including: two or more of the multicolor light emitting diode lamps for plant growth according to any one of [1] to [3], wherein the multicolor light emitting diode lamps for plant growth are disposed at approximately equal intervals and configured to be independently controllable.

[5] The illumination apparatus for plant growth according to [4], wherein the number of multicolor light emitting diode lamps for plant growth is controllable in accordance with a growth area of plants.

[6] The illumination apparatus for plant growth according to [4] or [5], wherein a photon flux of the multicolor light emitting diode lamp for plant growth is controllable in accordance with the distance between the light emitting diode lamp and plants.

[7] The illumination apparatus for plant growth according to any one of [4] to [6], wherein an electric current applied to the multicolor light emitting diode lamp for plant growth is pulse-driven, and wherein a lighting time of the multicolor light emitting diode lamp for plant growth is controllable in accordance with the growth state of the plants.

[8] The illumination apparatus for plant growth according to any one of [4] to [7], further including: a light guide panel having a light extraction surface, wherein light of the multicolor light emitting diode lamp for plant growth taken from a side surface of the light guide panel is extractable from the light extraction surface.

[9] A plant growth method of controlling a combination of one or more of the number of multicolor light emitting diode lamps for plant growth lit, the photon flux, the applied electric current, and the pulse driving time of the illumination apparatus for plant growth according to any one of [4] to [8] in accordance with the growth state of plants.

According to the multicolor light emitting diode lamp for plant growth of the present invention, one or more of the first light emitting diodes (red) in which the peak luminescence wavelength is not less than 655 nm and not more than 675 nm and one or more of the second light emitting diodes (blue) in which the peak luminescence wavelength is not less than 420 nm and not more than 470 nm are mounted in the same package. As a result, since a lighting circuit can be simplified, it is possible to provide a high-output, high-efficiency, and low-cost light source for plant growth.

Moreover, the photon flux R of the first light emitting diode and the photon flux B of the second light emitting diode mounted in the multicolor light emitting diode lamp for plant growth of the present invention are configured to satisfy the relation of R>B using the same electric current. As a result, it is possible to irradiate light uniformly while maintaining an intensity ratio between red and blue light which is ideal for plant growth.

Moreover, according to the illumination apparatus for plant growth of the present invention, since the multicolor light emitting diode lamp for plant growth is used, mixed color light that is optimal to plant growth can be supplied from the individual multicolor light emitting diodes to plants. As a result, it is possible to maintain the balance between red and blue light at the central portion and the peripheral portion of an irradiation surface of the illumination apparatus. Thus, it is possible to irradiate light uniformly while maintaining an intensity ratio between red and blue light which is ideal for plant growth. Moreover, since the multicolor light emitting diodes are disposed substantially at equal intervals and are independently controllable, it becomes easy to design an illumination apparatus capable of supplying light from multiple directions.

Moreover, the number of multicolor light emitting diode lamps lit can be adjusted in accordance with the growth area of plants, and the photon flux of the multicolor light emitting diode lamp can be adjusted in accordance with the distance between the multicolor light emitting diode lamp and plants. Thus, it is possible to decrease power consumption.

Furthermore, in the configuration in which the electric current applied to the multicolor light emitting diode lamp is pulse-driven, the lighting time of the multicolor light emitting diode lamp can be controlled in accordance with the growth state of the plants. Thus, it is possible to decrease power consumption.

Furthermore, according to the illumination apparatus for plant growth of the present invention, since the multicolor light emitting diode lamp in which mixed color light is generated within the package is used, the illumination apparatus can be configured as a light source which emits uniform luminescence using a light guide panel. Moreover, since the multicolor light emitting diode lamp can emit multicolor luminescence, it is possible to provide an illumination apparatus having an edge-type backlight structure in which light of the multicolor light emitting diode lamp taken from the side surface of the light guide panel is extracted from the light extraction surface.

According to the plant growth method of the present invention, it is possible to control a combination of the number of light emitting diode lamps lit, the photon flux, the applied electric current, and the pulse driving time of the illumination apparatus for plant growth. As a result, it is possible to irradiate blue and red light uniformly with the optimal balance in accordance with the growth state of the plants.

BRIEF DESCRIPTION OF DRAWINGS

FIGS. 1A and 1B are diagrams for explaining a multicolor light emitting diode lamp for plant growth according to an embodiment of the present invention, in which FIG. 1A is a plan view, and FIG. 1B is a cross-sectional view taken along the line A-A' in FIG. 1A.

FIGS. 2A and 2B are diagrams for explaining a red light emitting diode used in the multicolor light emitting diode lamp for plant growth according to the embodiment of the present invention, in which FIG. 2A is a plan view, and FIG. 2B is a cross-sectional view taken along the line B-B' in FIG. 2A.

FIGS. 3A and 3B are diagrams for explaining a blue light emitting diode used in the multicolor light emitting diode lamp for plant growth according to the embodiment of the present invention, in which FIG. 3A is a plan view, and FIG. 3B is a cross-sectional view taken along the line B-B' in FIG. 3A.

FIGS. 5A to 5C are diagrams for explaining a light emitting diode lamp according to a second embodiment of the present invention, in which FIG. 5A is a plan view, FIG. 5B is a cross-sectional view taken along the line D-D' in FIG. 5A, and FIG. 5C is a circuit diagram.

FIGS. 6A to 6C are diagrams for explaining a light emitting diode lamp according to a third embodiment of the present invention, in which FIG. 6A is a plan view, FIG. 6B is a cross-sectional view taken along the line E-E' in FIG. 6A, and FIG. 6C is a circuit diagram.

FIGS. 7A and 7B are diagrams for explaining a light emitting diode lamp according to a fourth embodiment of the present invention, in which FIG. 7A is a plan view, and FIG. 7B is a cross-sectional view taken along the line F-F' in FIG. 7A.

FIGS. 10A and 10B are diagrams for explaining a conventional mixed color light source, in which FIG. 10A is a plan view, and FIG. 10B is a cross-sectional view taken along the line G-G' in FIG. 10A.

DESCRIPTION OF EMBODIMENTS

Figure 1A:
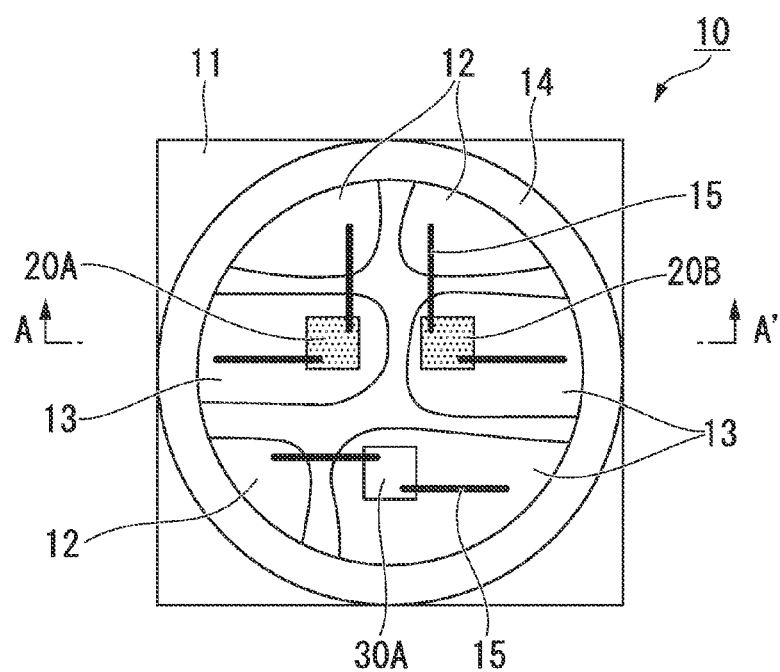

Hereinafter, a multicolor light emitting diode for plant growth according to an embodiment to which the present invention is applied and an illumination apparatus for plant growth using the same will be described in detail along with a plant growth method by using the drawings. In addition, in the drawings which are used in the following description, there is a case where characteristic sections are enlarged and shown for convenience in order to facilitate the understanding of features, and the size ratio or the like of each constituent element is not necessarily the same as the actual condition.

<First Embodiment>

The configuration of a multicolor light emitting diode lamp for plant growth (hereinafter simply referred to as a "light emitting diode lamp") according to an embodiment to which the present invention is applied will be described.

Figure 1B:
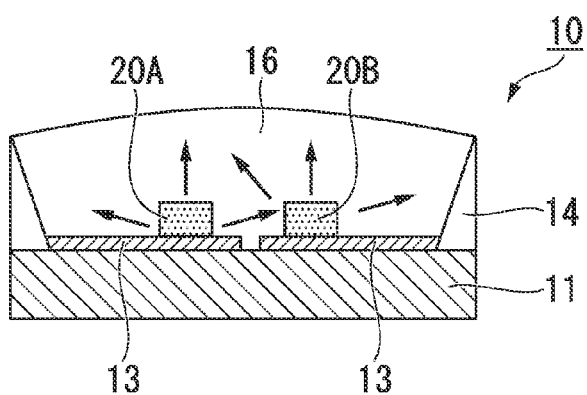

As shown in FIGS. 1A and 1B, a light emitting diode lamp 10 of the present embodiment is schematically configured such that three light emitting diodes 20A, 20B, and 30A are independently mounted on the surface of a mount substrate 11. More specifically, the light emitting diodes 20A and 20B (first light emitting diode) are red light emitting diodes in which a peak luminescence wavelength is not less than 655 nm and not more than 675 nm, and the light emitting diode 30A (second light emitting diode) is a blue light emitting diode in which a peak luminescence wavelength is not less than 420 nm and not more than 470 nm.

(Red Light Emitting Diode)

Figure 2A:
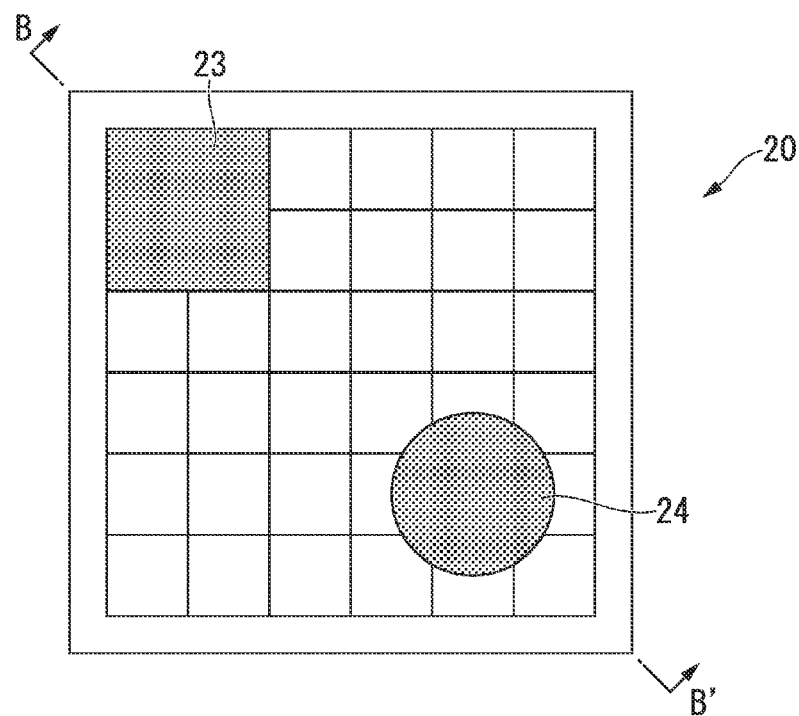
Figure 2B:
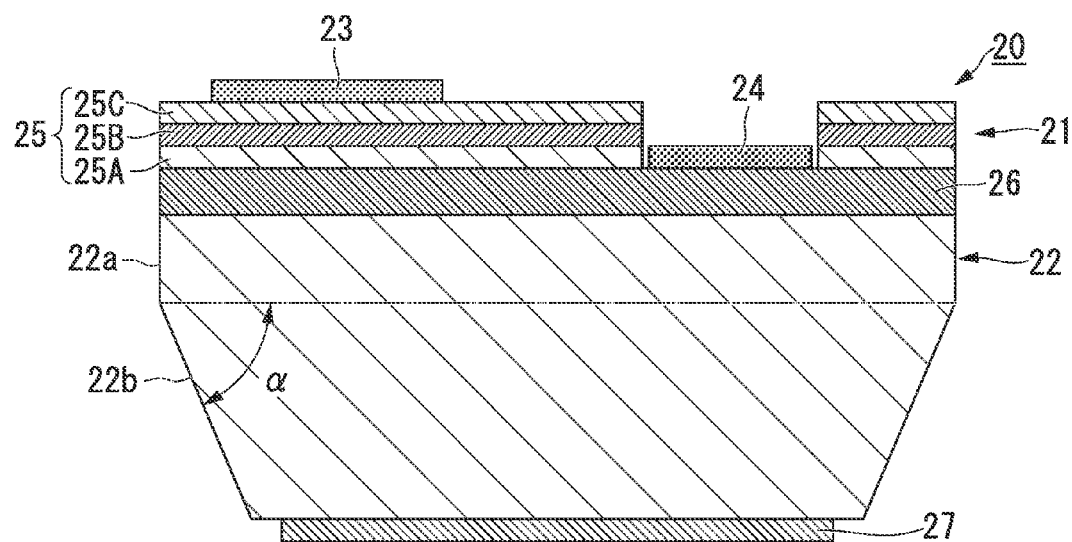

Here, the configuration of the red light emitting diodes 20A and 20B which each are the first light emitting diode used in the present embodiment will be described. FIGS. 2A and 2B are diagrams for explaining the red light emitting diode 20 (20A and 20B) used in the present embodiment, in which FIG. 2A is a plan view, and FIG. 2B is a cross-sectional view taken along the line B-B in FIG. 2A.

As shown in FIGS. 2A and 2B, the red light emitting diode 20 is a light emitting diode in which a compound semiconductor layer 21 and a functional substrate 22 are bonded to each other. Moreover, the red light emitting diode 20 is schematically configured to include a n-type ohmic electrode 23 and a p-type ohmic electrode 24 which are formed on a main light extraction surface. In addition, the main light extraction surface in the present embodiment means a surface of the compound semiconductor layer 21 on a side opposite to the surface to which the functional substrate 22 is attached.

The compound semiconductor layer 22 has a structure in which a pn-junction type light emitting section 25 in which a peak luminescence wavelength is not less than 655 nm and not more than 675 nm and a current diffusion layer 26 for diffusing an element driving current in a planar manner in the whole of the light emitting section are sequentially stacked.

As shown in FIG. 2B, the light emitting section 25 has a configuration in which at least p-type lower cladding layer 25A, a light emitting layer 25B, and an n-type upper cladding layer 25C are sequentially stacked on the current diffusion layer 26. That is, in order to obtain high-intensity luminescence, it is preferable that the light emitting section 25 has a so-called double hetero (DH) structure which includes the lower cladding layer 25A and the upper cladding layer 25C disposed to confront each other on the lower and upper sides of the light emitting layer 25B so that a carrier leading to radiation recombination and luminescence are "confined" in the light emitting layer 25B.

The light emitting layer 25B is constituted by a semiconductor layer having a composition formula, $(Al_XGa_{1-X})_YIn_{1-Y}P$ ($0 \leq X \leq 0.1$ and $0 < Y \leq 1$). The light emitting layer 25B may have an optional structure selected from a double hetero structure, a single quantum well (SQW) structure, and a multiple quantum well (MQW) structure. However, in order to obtain excellent monochromatic luminescence, it is preferable that the light emitting layer 25B has the MQW structure.

It is preferable that the thickness of the light emitting layer 25B is in the range of 0.02 to 2 μm. Moreover, the conduction type of the light emitting layer 25B is not particularly limited, but an optional conduction type can be selected from an undoped type, a p type, and an n type. In order to improve luminescence efficiency, it is preferable that the light emitting layer 25B has an undoped type having excellent crystallinity or has a carrier concentration of less than $3 \times 10^{17}$ cm$^{-3}$.

The light emitting diode 1 which includes the light emitting layer 25B having a composition formula, $(Al_XGa_{1-X})_YIn_{1-Y}P$ ($0 \leq X \leq 0.1$ and $0 < Y \leq 1$) has a high output compared to the conventional AlGaAs-based light emitting diode, and a wavelength range of not less than 655 nm and not more than 675 nm can be suitably used for an illumination (a light emitting diode lamp or an illumination apparatus) which is used for the promotion of photosynthesis in plant growth.

As shown in FIG. 2B, the lower cladding layer 25A and the upper cladding layer 25C are provided on the lower and upper surfaces of the light emitting layer 25B, respectively. The lower cladding layer 25A and the upper cladding layer 25C are configured such that the polarities thereof are different from each other. Moreover, known preferred ranges can be used as for the carrier concentration and the thickness of the lower cladding layer 25A and the upper cladding layer 25C, and it is preferable to optimize conditions so that the luminescence efficiency of the light emitting layer 25B is improved.

Specifically, as for the lower cladding layer 25A, it is preferable to use a Mg-doped p-type semiconductor material having a composition of $(Al_XGa_{1-X})_YIn_{1-Y}P$ ($0.3 \leq X \leq 1$ and $0 < Y \leq 1$), for example. Moreover, the carrier concentration in the range of from $2 \times 10^{17}$ to $2 \times 10^{18}$ cm$^{-3}$ is preferable, and the thickness in the range of from 0.5 to 5 μm is preferable.

On the other hand, as for the upper cladding layer 25C, it is preferable to use a Si-doped n-type semiconductor material having a composition of $(Al_XGa_{1-X})_YIn_{1-Y}P$ ($0.3 \leq X \leq 1$ and $0 < Y \leq 1$), for example. Moreover, the carrier concentration in a range of from $1 \times 10^{17}$ to $1 \times 10^{18}$ cm$^{-3}$ is preferable, and the thickness in a range of from 0.5 to 2 μm is preferable. In addition, the polarities of the lower cladding layer 25A and the upper cladding layer 25C can be appropriately selected by taking an element structure of the compound semiconductor layer 21 into consideration.

Moreover, an intermediate layer for slowly changing band discontinuity between both layers may also be provided between the lower cladding layer 25A and the light emitting layer 25B, between the light emitting layer 25B and the upper cladding layer 25C, and between the upper cladding layer 25A and the current diffusion layer 26. In this case, it is preferable that each intermediate layer is formed of a semiconductor material having a forbidden band width intermediate to that of both layers.

Moreover, a known layer structure such as a contact layer for reducing contact resistance of the ohmic electrodes, or a current blocking layer or current constriction layer for restricting an area through which an element driving current flows, can be provided above the constituent layers of the light emitting section 25.

As shown in FIG. 2B, the current diffusion layer 26 is provided below the light emitting section 25 in order to diffuse an element driving current in a planar manner in the whole of the light emitting section 25. In this way, the red light emitting diode 20 can uniformly emit light from the light emitting section 25.

As for the current diffusion layer 26, a material having a composition of $(Al_XGa_{1-X})_YIn_{1-Y}P$ ($0 \leq X \leq 0.7$ and $0 < Y \leq 1$) can be applied. It is most preferable to use GaP which does not contain Al as the current diffusion layer 26.

As shown in FIG. 2B, the functional substrate 22 is bonded to the current diffusion layer 26 that constitutes the compound semiconductor layer 21. The functional substrate 22 is formed of a material which has sufficient strength to mechanically support the light emitting section 25 and in which a forbidden band width capable of transmitting luminescence emitted from the light emitting section 25 is wide, and which is optically transparent to the wavelength of the luminescence from the light emitting layer 25B. For example, the functional substrate 22 can be formed of an insulating substrate made from: group III-V compound semiconductor crystals such as gallium phosphide (GaP), gallium aluminum arsenide (AlGaAs), or gallium nitride (GaN); group II-VI compound semiconductor crystals such as zinc sulfide (ZnS) or zinc selenide (ZnSe); group IV semiconductor crystals such as hexagonal or cubic silicon carbide (SiC); glass; or sapphire.

On the other hand, a functional substrate in which the bonding surface includes a surface having high reflectivity can be selected. For example, a metal substrate or an alloy substrate in which silver, gold, copper, or aluminum is formed on the surface, a composite substrate in which a metal mirror structure is formed in semiconductors, and the like can be selected. It is most preferable to select the material of the functional substrate from the same materials as a distortion adjustment layer in which there is no influence of distortion caused by bonding.

It is preferable that the functional substrate 22 has a thickness of about 50 μm or more, for example, in order to support the light emitting section 25 with a mechanically sufficient strength. Moreover, in order to facilitate mechanical working of the functional substrate 22 after being bonded to the compound semiconductor layer 21, it is preferable to set the thickness of the functional substrate 22 so as not to exceed 300 μm.

Moreover, as shown in FIG. 2B, the side surface of the functional substrate 22 includes a vertical surface 22a that is disposed on a side close to the compound semiconductor layer 21 and is approximately vertical to the main light extraction surface and an inclined surface 22b that is disposed on a side distant from the compound semiconductor layer 21 and is inclined inwardly to the main light extraction surface. As a result, light emitted from the light emitting layer 25B toward the functional substrate 22 can be efficiently extracted to the outside. Moreover, a part of the light emitted from the light emitting layer 25B toward the functional substrate 22 can be reflected by the vertical surface 22a and be extracted by the inclined surface 22b. On the other hand, the light reflected by the inclined surface 22b can be extracted by the vertical surface 22a. As above, light extraction efficiency can be improved by the synergy effect of the vertical surface 22a and the inclined surface 22b.

Moreover, in the present embodiment, as shown in FIG. 2B, it is preferable that the angle α between the inclined surface 22b and a surface parallel to the light emitting surface is set to be within the range of 55 to 80°. With such a range, the light reflected by the bottom portion of the functional substrate 22 can be efficiently extracted to the outside.

Moreover, it is preferable that the width (in the thickness direction) of the vertical surface 22a is set to be within the range of 30 to 100 μm. By setting the width of the vertical surface 22a to be within the above range, the light reflected by the bottom portion of the functional substrate 22 can be efficiently returned to the light emitting surface in the vertical surface 22a and be emitted from the main light extraction surface. As a result, it is possible to improve the luminescence efficiency of the red light emitting diode 20.

Moreover, it is preferable that the inclined surface 22b of the functional substrate 22 is roughened. When the inclined surface 22b is roughened, the effect of improving the efficiency of extracting light from the inclined surface 22b is obtained. That is, by roughening the inclined surface 22b, it is possible to suppress total reflection on the inclined surface 22b and to improve light extraction efficiency.

In some cases, the interface surface at which the compound semiconductor layer 21 and the functional substrate 22 are bonded to each other becomes a high-resistance layer. That is, a high-resistance layer (not shown) is often formed between the compound semiconductor layer 21 and the functional substrate 22. This high-resistance layer exhibits a higher resistance value than the functional substrate 22, and has a function of decreasing a backward electric current flowing from the current diffusion layer 26 of the compound semiconductor layer 21 toward the functional substrate 22. Moreover, although the high-resistance layer forms a junction structure which exhibits voltage resistance to a backward voltage applied inadvertently from the functional substrate 22 toward the current diffusion layer 26, it is preferable that the breakdown voltage thereof is lower than the backward voltage of the pn-junction type light emitting section 25.

The n-type ohmic electrode 23 and the p-type ohmic electrode 24 are low-resistance ohmic contact electrodes provided on the main light extraction surface of the red light emitting diode 20. Here, the n-type ohmic electrode 23 is provided above the upper cladding layer 25C, and AuGe or an alloy composed of Ni alloy and Au can be used, for example. On the other hand, the p-type ohmic electrode 24 is provided on the exposed surface of the current diffusion layer 26, as shown in FIG. 2B, and an alloy composed of AuBe and Au can be used.

Here, in the red light emitting diode 20 of the present embodiment, in order to lower the operating voltage to achieve high efficiency, it is preferable to form the p-type ohmic electrode 24 on the current diffusion layer 26. With such a configuration, such an effect is obtained.

Moreover, in the red light emitting diode 20, as shown in FIG. 2A, it is preferable to dispose the n-type ohmic electrode 23 and the p-type ohmic electrode 24 so as to be at diagonal positions. Furthermore, it is most preferable to take a configuration in which the p-type ohmic electrode 24 is surrounded by the compound semiconductor layer 21. With such a configuration, the effect of lowering the operating voltage is obtained. Furthermore, by surrounding the four sides of the p-type ohmic electrode 24 with the n-type ohmic electrode 23, it becomes easy for an electric current to flow in all directions. As a result, the operating voltage decreases.

Moreover, as shown in FIG. 2A, in the red light emitting diode 20, it is preferable to form the n-type ohmic electrode 23 into the form of a reticulation such as a honeycomb or a lattice shape. With such a configuration, the effect of improving reliability is obtained. Furthermore, by forming it into the form of a grid, it is possible to uniformly inject an electric current into the light emitting layer 25B, and as a result, the effect of improving reliability is obtained. In addition, in the red light emitting diode 20 of the present embodiment, it is preferable to form the n-type ohmic electrode 23 with a pad-shaped electrode (a pad electrode) and an electrode of a linear shape (a linear electrode) having a width of 10 μm or less. With such a configuration, higher brightness can be attained. Furthermore, by narrowing the width of the linear electrode, it is possible to increase an opening area of the light extraction surface and to achieve higher brightness.

In addition, it is preferable that a connection layer 27 is provided on the bottom surface of the functional substrate 22 as shown in FIG. 2B. As for the connection layer 27, a stacked structure made up of a reflecting layer, a barrier layer, and a connection layer can be used, for example. As for the reflecting layer, metals having high reflectivity (for example, silver, gold, aluminum, or platinum) and an alloy of these metals can be used. Moreover, an oxide film formed of a transparent conductive film made from an indium tin oxide (ITO) or an indium zinc oxide (IZO), for example, may be provided between the functional substrate 3 and the reflecting layer. Furthermore, as for the barrier layer, high melting point metals such as, for example, tungsten, molybdenum, titanium, platinum, chromium, or tantalum can be used. Furthermore, as for the connection layer, high melting point eutectic metals such as, for example, AuSn, AuGe, or AuSi can be used.

(Blue Light Emitting Diode)

Figure 3A:
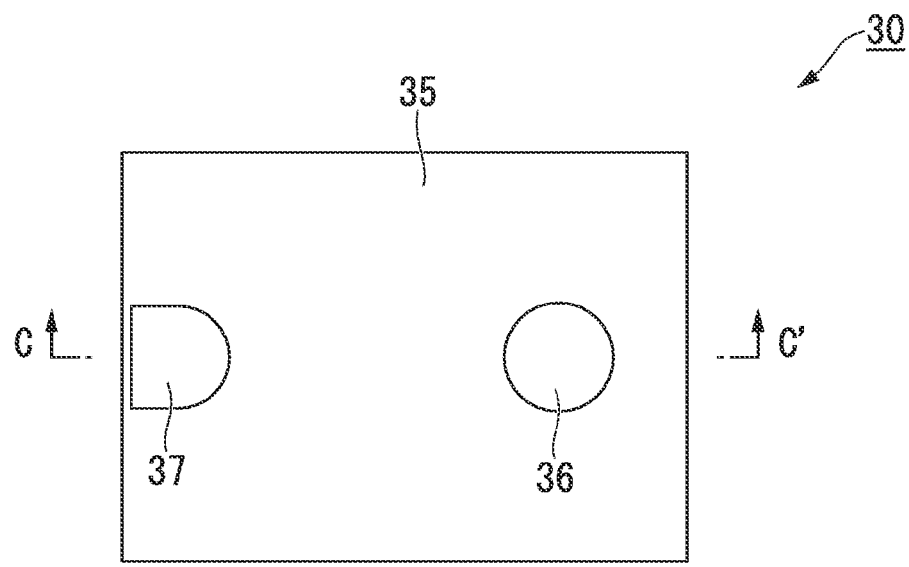
Figure 3B:
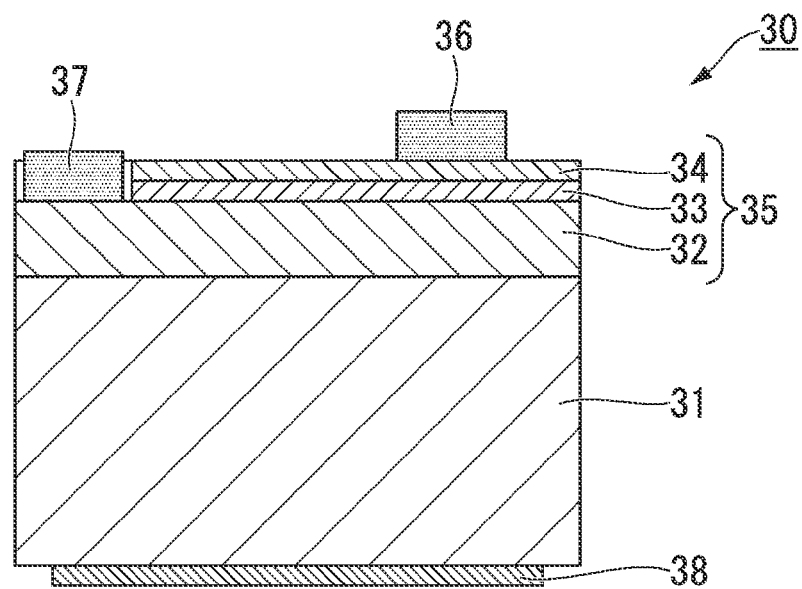

Next, the configuration of the blue light emitting diode 30A which is the second light emitting diode used in the present embodiment will be described. FIGS. 3A and 3B are diagrams for explaining the blue light emitting diode 30 (30A) used in the present embodiment, in which FIG. 3A is a plan view, and FIG. 3B is a cross-sectional view taken along the line B-B' in FIG. 3A.

As shown in FIGS. 3A and 3B, the blue light emitting diode 30 is schematically configured such that a semiconductor layer 35 in which a n-type semiconductor layer 32, a light emitting layer 33, and a p-type semiconductor layer 34 are sequentially stacked is formed on a substrate 31, and a transparent conductive film (not shown) is formed on the p-type semiconductor layer 34. Moreover, a buffer layer and a base layer which are not shown are sequentially formed on the substrate 31, and the n-type semiconductor layer 32 constituting the semiconductor layer 35 is stacked on the base layer. Furthermore, a positive electrode 36 is formed on the transparent conductive film, and a negative electrode 37 is formed in an exposed region of the n-type semiconductor layer 32 in which a part of the semiconductor layer 35 is removed and exposed.

A material usable for the substrate 31 of the blue light emitting diode 30 of the present embodiment is not particularly limited if it is a substrate material in which group III nitride semiconductor crystals are epitaxially grown on the surface, and various kinds of materials can be selected and used. For example, examples of the material of the substrate 31 include sapphire, SiC, silicon, and the like. Moreover, among the respective substrate materials, it is preferable to use sapphire, in particular. Furthermore, it is more preferable that a buffer layer, of which the details are described later, is formed on a principal surface made up of the c-surface of the substrate 31 formed of sapphire.

The buffer layer is provided as a layer that matches the difference in lattice constant between the substrate 31 and the layer formed of group III nitride semiconductors. The buffer layer is formed of group III single-crystal nitrides such as AlGaN or AlN, for example. By including such a buffer layer, the group III nitride semiconductors formed thereon become a crystal film having satisfactory orientation and crystallinity.

The respective layers of the base layer, the n-type semiconductor layer 32, the light emitting layer 33, and the p-type semiconductor layer 34, formed on the buffer layer are formed of group III nitride semiconductors, for example, and gallium nitride-based compound semiconductors expressed by a composition formula, $Ga_XIn_{1-X}N$ (0≤X≤1), can be used without any limitation.

As the base layer, group III nitride-based compounds including Ga, namely GaN-based compound semiconductors are used, and in particular, single-crystal GaN can be ideally used.

The n-type semiconductor layer 32 is formed by sequentially stacking an n-type contact layer and an n-type cladding layer which are not shown. As for the n-type contact layer, $Ga_XIn_{1-X}N$ (0≤X≤1) can be used similarly to the base layer, for example, and it is preferable that n-type impurities such as Si, Ge, or Sn are doped. Moreover, the n-type cladding layer can be formed of GaN, GaInN, or the like, for example, and a heterojunction of these structures and a superlattice structure in which these structures are stacked a plurality number of times may be used.

The light emitting layer 33 is an active layer which is stacked on the n-type semiconductor layer 32 and in which the p-type semiconductor layer 34 is stacked thereon. In the light emitting layer 33, a barrier layer and a well layer which are not shown are alternately stacked in such an order than the barrier layer is disposed on the n-type semiconductor layer 32 and the p-type semiconductor layer 34. As for the barrier layer, gallium nitride-based compound semiconductors such as $Al_cGa_{1-c}N$ (0≤c≤0.3) of which the band gap energy is greater than the well layer formed of gallium nitride-based compound semiconductor containing indium, for example, can be ideally used. Moreover, as for the well layer, gallium indium nitride such as $Ga_{1-s}In_sN$ (0<s<0.4), for example, can be used as the gallium nitride-based compound semiconductor containing indium.

The p-type semiconductor layer 34 is formed on the light emitting layer 33, and generally has a configuration (not shown) in which a p-type cladding layer and a p-type contact layer are sequentially stacked. As for the p-type cladding layer, it is preferable to use a material having such a composition that the band gap energy of the light emitting layer 33 is greater than the light emitting layer 33 of which the details will be described later. For example, a material having a composition, $Al_dGa_{1-d}N$ (0<d≤0.4, and preferably, 0.1≤d≤0.3) is preferred. Moreover, the p-type cladding layer is preferably formed of a material including at least $Al_eGa_{1-e}N$ (0≤e<0.5, and preferably, and more preferably, 0≤e≤0.1). As above, the range of the Al composition of the p-type cladding layer is preferred from the perspective of maintaining satisfactory crystallinity and obtaining satisfactory ohmic contact with a transparent conductive film disposed thereabove. Moreover, the p-type semiconductor layer 34 having the above composition preferably has a configuration in which p-type impurities such as Mg are doped.

The transparent conductive film is a translucent p-type electrode provided on the p-type contact layer.

As for the transparent conductive film, a material including at least one kind selected from ITO ($In_2O_3$—$SnO_2$), AZO (ZnO—$Al_2O_3$), IZO ($In_2O_3$—ZnO), and GZO (ZnO—$Ga_2O_3$), for example, can be provided by a conventional method widely known in this technical field. Moreover, as for the structure of the transparent conductive film, an optional structure including any of the conventionally known structures can be used without any limitation. Furthermore, the transparent conductive film may be formed so as to cover substantially the entire surface on the p-type contact layer and may be formed into a lattice shape or a brenched shape with gaps therein. Furthermore, after forming the transparent conductive film, a thermal treatment aimed at alloying and transparency may or may not be performed.

The positive electrode 36 is an electrode formed on the transparent conductive film. As for the positive electrode 36, various kinds of structures using Au, Al, Ni, and Cu are well known, and any of these known materials or structures can be used without any limitation.

The negative electrode 37 is an electrode formed so as to come in contact with an n-type contact layer 4b of the n-type semiconductor layer 32. When forming the negative electrode 37, part of the p-type semiconductor layer 34, the light emitting layer 33, and the n-type semiconductor layer 32 are removed to form an exposed region of the n-type contact layer 4b, and the negative electrode 37 is formed thereon. As for the material of the negative electrode 37, negative electrodes having various kinds of compositions and structures are widely known, and any of these known negative electrodes can be used without any limitation.

In addition, it is preferable that a connection layer 38 is provided on the bottom surface of the substrate 31 as shown in FIG. 3B. As for the connection layer 38, a stacked structure made up of a reflecting layer, a barrier layer, and a connection layer can be used, for example. As for the reflecting layer, metals having high reflectivity (for example, silver, gold, aluminum, or platinum) and an alloy of these metals can be used. Moreover, an oxide film formed of a transparent conductive film made from an indium tin oxide (ITO) or an indium zinc oxide (IZO), for example, may be provided between the substrate 31 and the reflecting layer. Furthermore, as for the barrier layer, high melting point metals such as, for example, tungsten, molybdenum, titanium, platinum, chromium, or tantalum can be used. Furthermore, as for the connection layer, high melting point eutectic metals such as, for example, AuSn, AuGe, or AuSi can be used.

(Multicolor Light Emitting Diode Lamp)

Next, the configuration of the light emitting diode lamp 10 according to the present embodiment will be described.

As shown in FIGS. 1A and 1B, the light emitting diode lamp 10 of the present embodiment is schematically configured such that three light emitting diodes 20A, 20B, and 30A are independently mounted on the surface of the mount substrate 11. Moreover, a plurality of n-electrode terminals 12 and a plurality of p-electrode terminals 13 are provided on the surface of the mount substrate 11, and the red light emitting diodes 20A and 20B are fixed and supported (mounted) on the p-electrode terminals 13 of the mount substrate 11 by the connection layer 27 or a silver (Ag) paste. Moreover, the n-type ohmic electrodes 23 of the red light emitting diodes 20A and 20B are connected to the n-electrode terminals 12 of the mount substrate 11, respectively, using gold wires 15 (wire bonding). The p-type ohmic electrodes 24 thereof are connected to the p-electrode terminals 13 of the mount substrate 11, respectively, using the gold wires 15.

Similarly, the blue light emitting diode 30A is fixed and supported (mounted) on the p-electrode terminal 13 by the connection layer 38 or a silver (Ag) paste. Moreover, the negative electrode 37 of the blue light emitting diode 30A is connected to the n-electrode terminal 12 of the mount substrate 11 using the gold wire 15, and the positive electrode 36 thereof is connected to the p-electrode terminal 13 of the mount substrate 11 using the gold wire 15.

The fact that the three light emitting diodes 20A, 20B, and 30A are independently mounted means that the three light emitting diodes 20A, 20B, and 30A are mounted so as to be electrically in parallel to each other.

A reflecting wall 14 stands on the surface of the mount substrate 11 so as to surround these light emitting diodes 20A, 20B, and 30A. A general sealing material 16 such as a silicon resin or an epoxy resin is filled in a space above the mount substrate 11 on the inner side of the reflecting wall 14. As a result, the light emitting diodes 20A, 20B, and 30A are sealed in a package. In this way, the light emitting diode lamp 10 of the present embodiment takes a configuration in which red and blue light emitting diodes are mounted in the same package.

Next, a method of manufacturing the light emitting diode lamp 10 using the light emitting diodes 20A, 20B, and 30A, namely a method of mounting the light emitting diodes 20A, 20B, and 30A will be described.

First, as shown in FIGS. 1A and 1B, a predetermined number of red light emitting diodes 20 (20A and 20B) are mounted on the surface of the mount substrate 11. When mounting the red light emitting diode 20, first, the mount substrate 11 and the red light emitting diode 20 are aligned, and the red light emitting diode 20 is disposed at a predetermined position on the surface of the mount substrate 11. Subsequently, the red light emitting diode 20 is die-bonded to the surface of the mount substrate 11 by the connection layer 27 provided on the bottom surface of the red light emitting diode 20. Subsequently, the n-type ohmic electrode 23 of the red light emitting diode 20 is connected to the n-electrode terminal 12 of the mount substrate 11 using the gold wire 15 (wire bonding). Subsequently, the p-type ohmic electrode 24 of the red light emitting diode 20 is connected to the p-electrode terminal 13 of the mount substrate 11 using the gold wire 15.

Subsequently, a predetermined number of blue light emitting diodes 30 (30A) are mounted on the surface of the mount substrate 11. When mounting the blue light emitting diode 30, first, the mount substrate 11 and the blue light emitting diode 30 are aligned, and the blue light emitting diode 30 is disposed at a predetermined position on the surface of the mount substrate 11. Subsequently, the blue light emitting diode 30 is die-bonded to the surface of the mount substrate 11 by the connection layer 38 provided on the bottom surface of the blue light emitting diode 30. Subsequently, the negative electrode 37 of the blue light emitting diode 30 is connected to the p-electrode terminal 12 of the mount substrate 11 using the gold wire 15. Subsequently, the positive electrode 36 of the blue light emitting diode 30 is connected to the p-electrode terminal 13 of the mount substrate 11 using the gold wire 15.

Finally, the surface of the mount substrate 11 on which the light emitting diodes 20A, 20B, and 30A are mounted is sealed by the sealing material 16. In this way, the light emitting diode lamp 10 of the present embodiment is manufactured.

A case when the light emitting diode lamp 10 having the above configuration emits luminescence will be described. As shown in FIG. 1B, the luminescence emitted upward from the light emitting sections of the respective light emitting diodes 20A, 20B, and 30A is luminescence emitted from the main light extraction surface. Thus, the luminescence can be directly extracted to the outside of the light emitting diode lamp 10. Moreover, the luminescence emitted downward from the light emitting sections of the respective light emitting diodes 20A, 20B, and 30A cannot be directly extracted to the outside of the light emitting diode lamp 10. Here, when the reflecting layers 27 and 38 are provided in the light emitting diodes 20A, 20B, and 30A, the light inside the respective light emitting diodes 20A, 20B, and 30A is reflected by the reflecting layers 27 and 38. Thus, the luminescence can be efficiently extracted to the outside of the light emitting diode lamp 10. Moreover, the luminescence emitted in the circumferential direction from the light emitting sections of the respective light emitting diodes 20A, 20B, and 30A cannot be directly extracted to the outside of the light emitting diode lamp 10. However, the light can be reflected to the surface of the mount substrate 11 by the reflecting wall 14. As above, the light emitting diode lamp 10 is a high-brightness light emitting diode lamp in which light extraction efficiency is improved.

In general, the use of a LED light source in plant growth provides many advantages in that it can irradiate light of a specific wavelength and it emits less heat and has a compact size. Moreover, according to recent studies on plant growth, it is reported that for plant growth, it is preferable to irradiate light of a mixed color of red having its peak wavelength around 660 nm and blue having its peak wavelength around 460 nm Here, when irradiating light of a mixed color of red and blue, the ratio of a red photon flux (R) to a blue photon flux (B) per LED light source using the same electric current has a great influence on plant growth and is an important parameter. Moreover, preferred results are obtained for the larger R although it depends on the kind of plants.

That is, it is preferable that the light emitting diode lamp 10 of the present embodiment is a light source in which a photon flux R (=0.2 [$\mu mol \cdot s^{-1}$] per electric current of 20 mA, of the red light emitting diode 20 (the total amount of 20A and 20B) and a photon flux B (=0.06 [$\mu mol \cdot s^{-1}$]) per electric current of 20 mA, of the blue light emitting diode 30 (30A) satisfy a relation of R>B. In particular, it is preferable that the value of the ratio (R/B ratio) of the red photon flux R to the blue photon flux B is 2 to 10.

Here, the photon fluxes R and B [$\mu mol \cdot s^{-1}$] can be calculated by collecting and measuring light radiated from a light emitting diode lamp.

Moreover, the photon flux density [$\mu mol \cdot m^2 \cdot s^{-1}$] is measured using a quantum meter located in front of a light source at a distance of 0.2 m from the light source, for example.

In addition the photon flux density is used as an indicator of a light intensity in general plant growth. In a white light source such as a fluorescent tube, the photon flux density is preferably 150 $\mu mol/s \cdot m^2$ or more. Since the LED light source of the present invention does not include a color component around a green component in which the photosynthetic efficiency of plants is not satisfactory, it is possible to grow plants with a lower number of photons. A photon flux density of 100 $\mu mol/s \cdot m^2$ or more is assumed to be in a preferred range.

Thus, in the light emitting diode lamp 10 of the present embodiment, the number of red light emitting diodes 20 mounted in a package needs to be greater than the number of blue light emitting diodes 30 mounted. However, in the light emitting diode lamp 10 of the present embodiment, since the number of red and blue light emitting diodes 20 and 30 mounted can be changed easily, it is possible to easily provide a light emitting diode lamp in which the R/B ratio has a desired value.

However, in the conventional LED light source, since a red light emitting diode using an AlGaAs-based light emitting layer is used, the photon flux thereof is smaller than that of a GaInN-based blue light emitting diode. Thus, in order to satisfy the relation of R/B>1, since six or more red light emitting diodes are required with respect to one blue light emitting diode, there is a problem in that it is difficult to mount a number of LEDs in the package of one light emitting diode lamp.

Figure 10A:
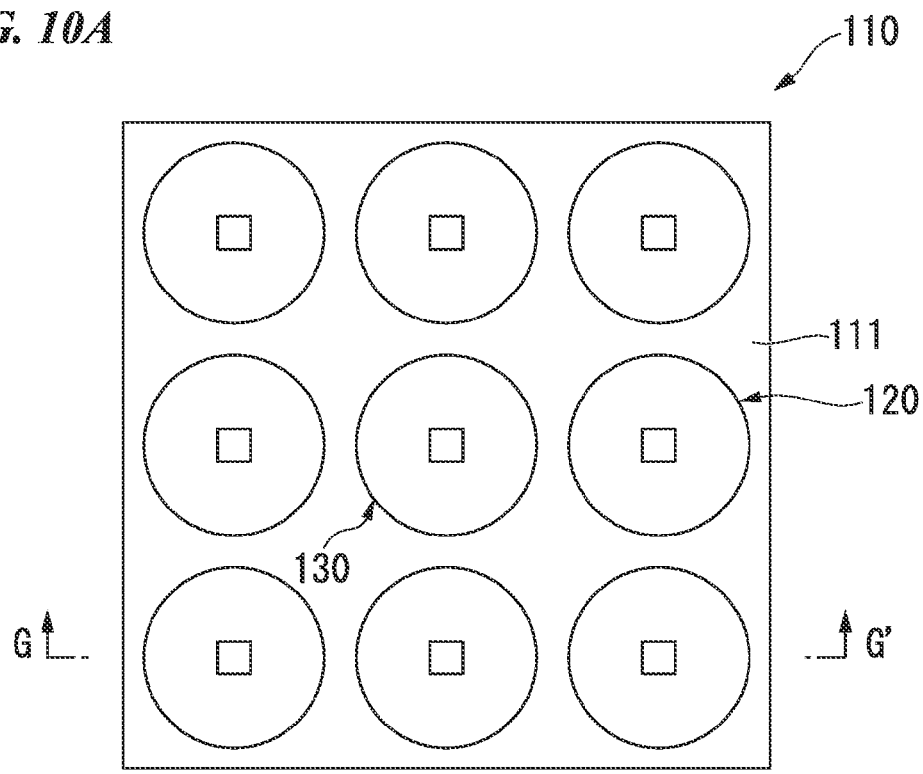
Figure 10B:
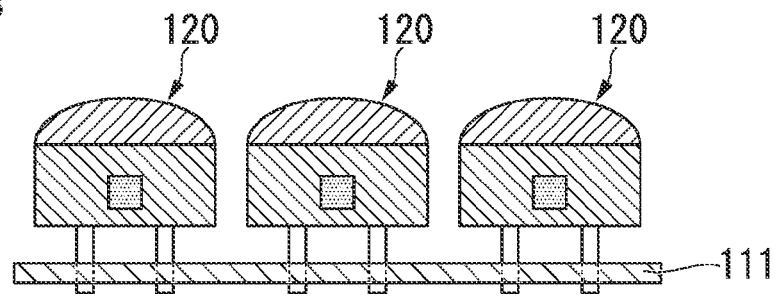

Therefore, as shown in FIGS. 10A and 10B, a conventional mixed color light source 110 has a configuration in which shell-shaped ($\phi$: 5 mm) red light emitting diode lamps 120 and a shell-shaped blue light emitting diode lamp 130 are individually disposed at intervals of 20 mm on the surface of a print substrate 111 of 60 mm square.

Moreover, in order to satisfy the relation of R/B>1, as shown in FIG. 10A, the mixed color light source 110 becomes a unit light source in which a total of nine light emitting diode lamps made up of eight red light emitting diode lamps 120 and one blue light emitting diode lamp 130 are mounted, for example. Thus, there is a problem in that the manufacturing cost of the lamp increases, and the size of the light source increases. In particular, since the red light source and the blue light source are separated by a distance of at least 10 mm or more, when such a lamp is used very close to plants which are subjects to be irradiated, there is a problem in that it is difficult to maintain a mixed color light (R/B) having satisfactory uniformity. Therefore, in the conventional mixed color light source 110, it is necessary to secure a sufficient distance from plants in order to maintain uniformity of a mixed color light, and there is a problem in that the advantages of the LED light source are not sufficiently attained.

In contrast, since the light emitting diode lamp 10 of the present embodiment uses a red diode 20 using an AlGaInP-based light emitting layer, it is possible to attain substantially the same photon flux as the GaInN-based blue light emitting diode 30. Thus, in order to satisfy the relation of R/B>1, since only one or more red light emitting diode is required with respect to one blue light emitting diode, it is possible to mount red and blue LEDs in the package of one light emitting diode lamp at the same time. That is, the light emitting diode lamp 10 of the present embodiment becomes a mixed color light emitting diode.

Moreover, according to the light emitting diode lamp 10 of the present embodiment, the distance between two adjacent light emitting diodes of the red and blue light emitting diodes 20 and 30 within the same package can be easily made to be within 5 mm. Thus, even when the light emitting diode lamp 10 is used very close to plants, it is possible to maintain uniformity of the R/B ratio.

(Illumination Apparatus for Plant Growth)

Next, the configuration of an illumination apparatus using the light emitting diode lamp 10 will be described.

In general, an illumination apparatus means an illumination apparatus which although not shown, includes at least a substrate in which a wiring, a through-hole, and the like are formed, a plurality of light emitting diode lamps mounted on the surface of the substrate, and a reflector or a shade having a concave shape in a cross-sectional view thereof and configured such that a light emitting diode lamp is mounted on a bottom portion of the inside of the concave portion.

Figure 4:
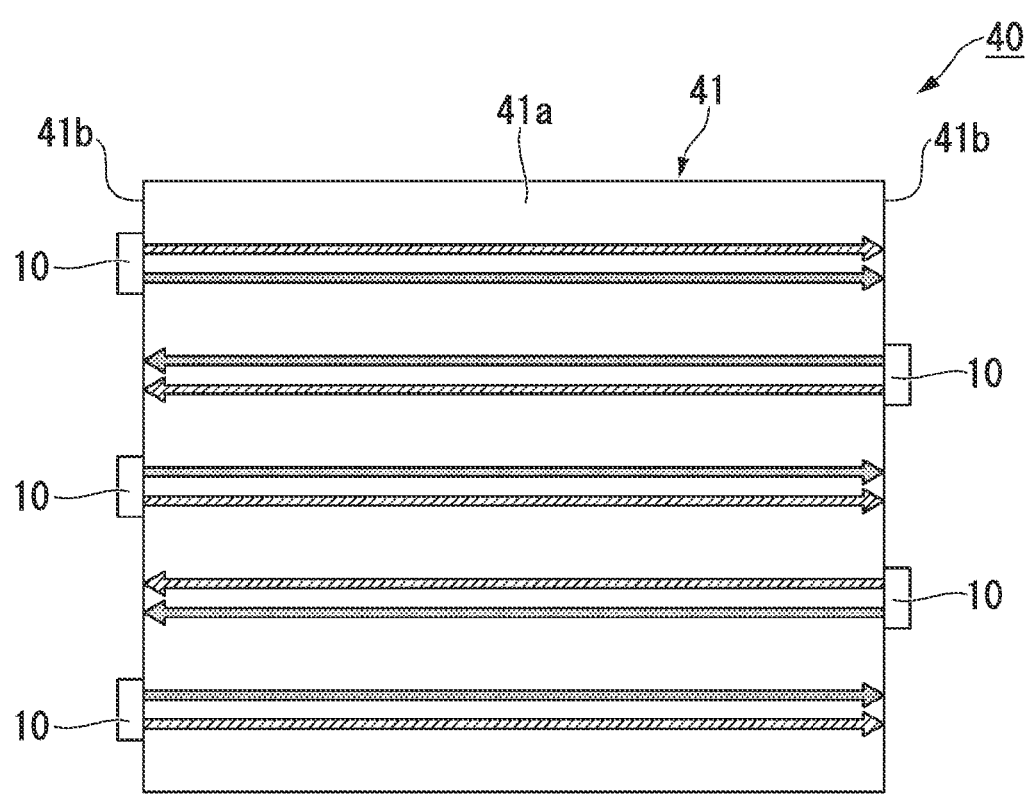
FIG. 4 is a cross-sectional schematic view illustrating an illumination apparatus for plant growth according to an embodiment of the present invention.

Moreover, examples of the illumination apparatus for plant growth include an illumination apparatus 40 having a configuration as shown in FIG. 4.

The illumination apparatus 40 is schematically configured to include two or more of the light emitting diode lamps 10 and a light guide panel 41 including a light extraction surface 41a. Here, the user of the light guide panel 41 enables increasing an irradiation area. More specifically, the respective light emitting diode lamps 10 are disposed on a side surface 41b of the light guide panel 41 at approximately equal intervals. Moreover, the light guide panel 41 is configured such that light of the light emitting diode lamp 10 taken from the side surface 41b can be extracted from the light extraction surface 41a. In addition, the respective light emitting diode lamps 10 are configured to be independently controllable.

When the respective light emitting diode lamps 10 are lit, light incident on the side surface 41b of the light guide panel 41 is irradiated from the light extraction surface 41a. Here, in the illumination apparatus 40 of the present embodiment, since the light emitting diode lamps 10 are disposed at equal intervals, the illuminance within the surface of the light extraction surface 41a can be made to be substantially uniform. Moreover, in the respective light emitting diode lamps 10, since the red and blue LEDs are mounted in the package at the same time as described above, the uniformity of the R/B ratio is satisfactory. Thus, according to the illumination apparatus 40 of the present embodiment, it is possible to maintain the uniformity of the R/B ratio in the whole of the light extraction surface 41a of the light guide panel 41.

Here, as a specific method of evaluating the uniformity of the R/B ratio in the illumination apparatus, a method of measuring the R/B ratio at the central position of an irradiation surface of the illumination apparatus and the R/B ratio at one or more positions separated by an optional position from the central position and evaluating the uniformity based on a comparison result can be used, for example.

Figure 11:
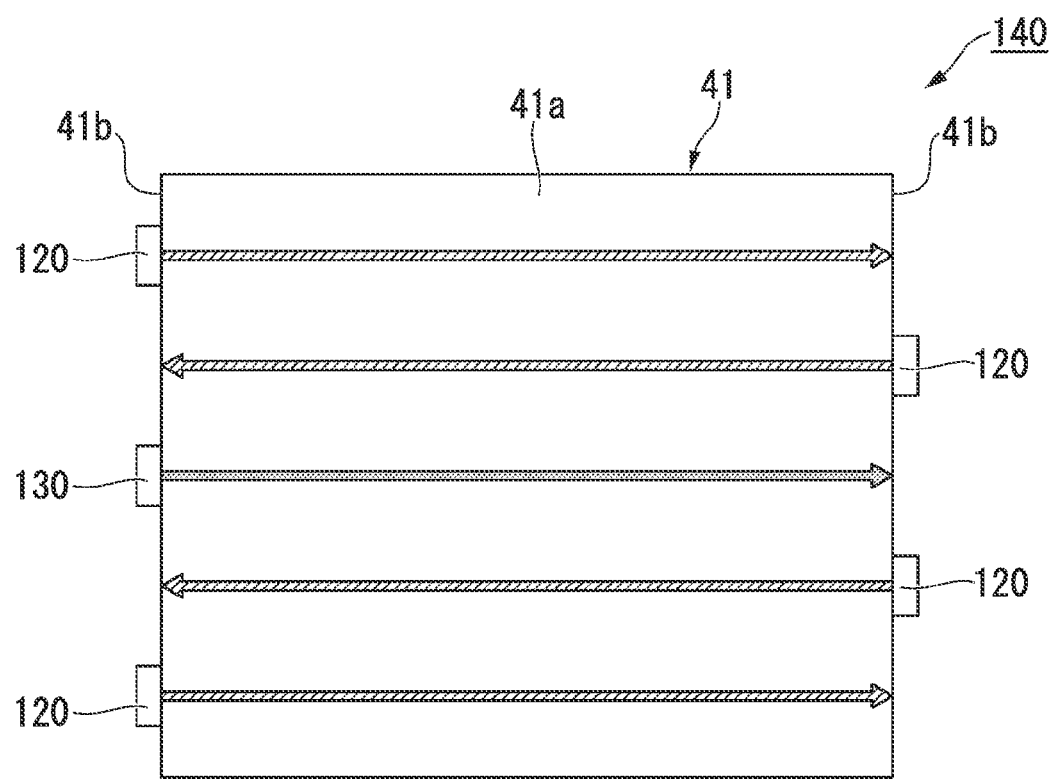
FIG. 11 is a cross-sectional schematic view illustrating a conventional illumination apparatus for plant growth.

However, as shown in FIG. 11, in a conventional illumination apparatus 140 using the light guide panel 41, four red light emitting diode lamps 120 and one blue light emitting diode lamp 130 are disposed on the side surface 41b of the light guide panel 41 substantially at equal intervals. However, unlike the present embodiment, since the respective light emitting diode lamps are not mixed color light sources, there is a problem in that it is not possible to maintain the uniformity of the R/B ratio in the whole of the light extraction surface 41a of the light guide panel 41. Specifically, as shown in FIG. 11, the blue light emitting diode lamp 130 is disposed at approximately the central portion of the side surface 41b of the light guide panel 41, and the red light emitting diode lamps 12 are disposed on the upper and lower sides of the side surface 41b. Thus, when the respective light emitting diode lamps are lit, in the central portion in the vertical direction of the light extraction surface 41a, the red photon flux R is smaller than the blue photon flux B. On the other hand, in the upper and lower portions of the light extraction surface 41a, the red photon flux R becomes excessively larger than the blue photon flux B.

In contrast, in the illumination apparatus 40 of the present embodiment, as described above, it is possible to maintain the uniformity of the R/B ratio in the whole of the light extraction surface 41a of the light guide panel 41.

Moreover, in the illumination apparatus 40 of the present embodiment, since the respective light emitting diode lamps 10 are configured to be independently controllable, it is possible to control the number of light emitting diode lamps 10 lit in accordance with a growth area of plants. Furthermore, it is possible to adjust the photon flux of the light emitting diode lamp 10 in accordance with the distance between the illumination apparatus 40 and plants. Furthermore, in the illumination apparatus 40 of the present embodiment, by driving the electric current applied to the light emitting diode lamp 10 in a pulsating manner, it is possible to adjust the lighting time of the light emitting diode lamp 10 in accordance with the growth state of the plants.

As described above, by using the illumination apparatus 40 of the present embodiment, it is possible to grow plants while controlling a combination of one or more of the number of light emitting diode lamps lit, the photon flux, the applied electric current, and the pulse driving time of the illumination apparatus 40.

As described above, according to the light emitting diode lamp 10 of the present embodiment, one or more of the red light emitting diodes 20A and 20B in which a peak luminescence wavelength is not less than 655 nm and not more than 675 nm and one or more of the blue light emitting diodes 30A in which a peak luminescence wavelength is not less than 420 nm and not more than 470 nm are mounted in the same package. As a result, since a lighting circuit can be simplified, it is possible to provide a high-output, high-efficiency, and low-cost light source for plant growth.

Moreover, the photon flux R of the red light emitting diode 20 (20A and 20B) and the photon flux B of the blue light emitting diode 30 are configured to satisfy the relation of R>B using the same electric current. As a result, it is possible to irradiate light uniformly while maintaining an intensity ratio between red and blue light which is ideal for plant growth.

Moreover, according to the illumination apparatus for plant growth 40 of the present embodiment, since the multicolor light emitting diode lamp for plant growth 10 is used, mixed color light that is optimal to plant growth can be supplied from the individual light emitting diodes 10 to plants. Moreover, since the light emitting diodes 10 are disposed substantially at equal intervals and are independently controllable, it becomes easy to design an illumination apparatus capable of supplying light from multiple directions.

Moreover, according to the illumination apparatus 40, the number of light emitting diode lamps 10 lit can be adjusted in accordance with the growth area of plants, and the photon flux of the light emitting diode lamp 10 can be adjusted in accordance with the distance between the illumination apparatus and plants. Thus, it is possible to decrease power consumption.

Furthermore, in the illumination apparatus 40 in which the electric current applied to the light emitting diode lamp 10 is pulse-driven, the lighting time of the light emitting diode lamp 10 can be controlled in accordance with the growth state of the plants. Thus, it is possible to decrease power consumption.

Furthermore, according to the illumination apparatus 40, since the light emitting diode lamp 10 in which mixed color light is generated within the package is used, the illumination apparatus 10 can be configured as a light source which emits uniform luminescence using the light guide panel 41. Moreover, since the light emitting diode lamp 10 can emit multicolor luminescence, it is possible to provide the illumination apparatus 40 having an edge-type backlight structure in which light of the light emitting diode lamp 10 taken from the side surface 41b of the light guide panel 41 is extracted from the light extraction surface 41a.

According to the plant growth method of the present embodiment, it is possible to control a combination of the number of light emitting diode lamps lit, the photon flux, the applied electric current, and the pulse driving time of the illumination apparatus 40. As a result, it is possible to irradiate blue and red light uniformly with the optimal balance in accordance with the growth state of the plants.

<Second Embodiment>

Next, a second embodiment to which the present invention is applied will be described. In the present embodiment, a light emitting diode lamp has a different configuration from the light emitting diode lamp 10 of the first embodiment. Thus, with regard to the configuration of the light emitting diode lamp of the present embodiment, the same constituent portions as the light emitting diode lamp 10 of the first embodiment will be denoted by the same reference signs, and redundant description thereof will not be provided.

Figure 5A:
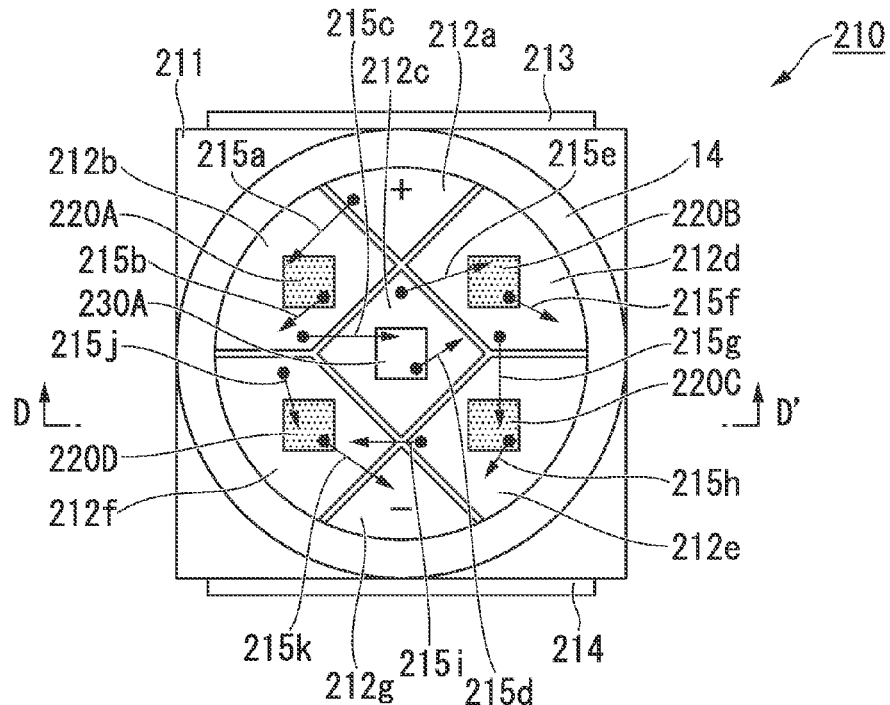
Figure 5B:
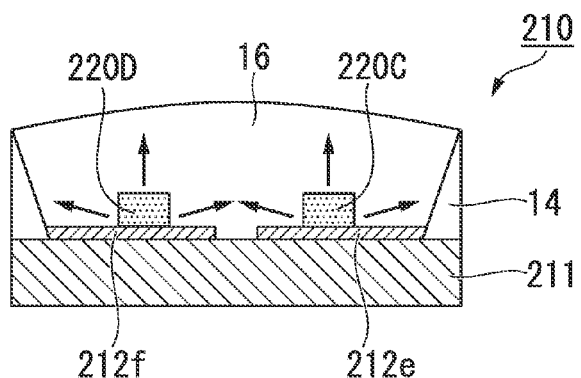

As shown in FIGS. 5A and 5B, a light emitting diode lamp 210 of the present embodiment is schematically configured such that five light emitting diodes 220A, 220B, 220C, 220D, and 230A are mounted on the surface of a mount substrate 211.

Figure 5C:
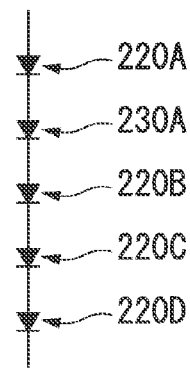

Here, in the light emitting diode lamp 10 of the first embodiment, the three mounted light emitting diodes 20A, 20B, and 30A are electrically independent. In contrast, in the light emitting diode lamp 210 of the present embodiment, as shown in FIGS. 5A and 5C, four red light emitting diodes 220A, 220B, 220C, and 220D and one blue light emitting diode 230A are mounted so as to be electrically in series to each other.

Specifically, as shown in FIG. 5A, a plurality of electrode terminals 212a to 212g is provided on the surface of the mount substrate 211. Moreover, the red light emitting diode 220A, the blue light emitting diode 230A, and the red light emitting diodes 220B, 220C, and 220D are mounted on the electrode terminals 212b, 212c, 212d, 212e, and 212f, respectively. Moreover, the electrode terminal 212A is electrically connected to a positive electrode 213 that is provided at one end side of the mount substrate 211. Furthermore, the electrode terminal 212g is electrically connected to a negative electrode 214 that is provided at the other end side of the mount substrate 211.

The electrode terminal 212a is connected to a p-type ohmic electrode (not shown) of the red light emitting diode 220A by a gold wire 215a. An n-type ohmic electrode of the red light emitting diode 220A is connected to the electrode terminal 212b by a gold wire 215b.

The electrode terminal 212b is connected to a positive electrode (not shown) of the blue light emitting diode 230A by a gold wire 215c. A negative electrode of the blue light emitting diode 230A is connected to the electrode terminal 212c by a gold wire 215d.

The electrode terminal 212c is connected to a p-type ohmic electrode (not shown) of the red light emitting diode 220B by a gold wire 215e. An n-type ohmic electrode of the red light emitting diode 220B is connected to the electrode terminal 212d by a gold wire 215f.

The electrode terminal 212d is connected to a p-type ohmic electrode (not shown) of the red light emitting diode 220C by a gold wire 215g. An n-type ohmic electrode of the red light emitting diode 220C is connected to the electrode terminal 212e by a gold wire 215h.

The electrode terminal 212e and the electrode terminal 212f are connected by a gold wire 215i.

The electrode terminal 212f is connected to a p-type ohmic electrode (not shown) of the red light emitting diode 220D by a gold wire j. An n-type ohmic electrode of the red light emitting diode 220d is connected to the electrode terminal 212g by a gold wire 215k.

According to the light emitting diode lamp 210 of the present embodiment, by applying a forward voltage between the positive electrode 213 and the negative electrode 214, the four red light emitting diodes 220A, 220B, 220C, and 220D and one blue light emitting diode 230A mounted so as to be electrically in series to each other can be lit altogether. On the other hand, when a backward voltage is applied between the positive electrode 213 and the negative electrode 214, the light emitting diode lamp 210 is not lit.

<Third Embodiment>

Next, a third embodiment to which the present invention is applied will be described. In the present embodiment, a light emitting diode lamp has a different configuration from the light emitting diode lamps 10 and 210 of the first and second embodiments. Thus, with regard to the configuration of the light emitting diode lamp of the present embodiment, the same constitutent portions as the light emitting diode lamps 10 and 210 of the first and second embodiments will be denoted by the same reference signs, and a redundant description thereof will not be provided here.

Figure 6A:
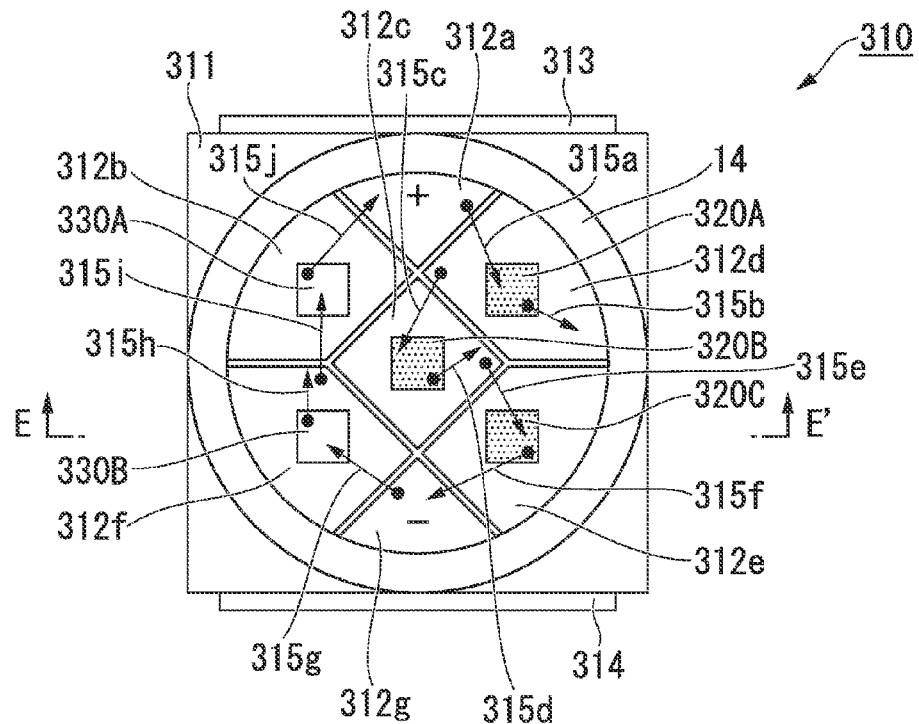
Figure 6B:
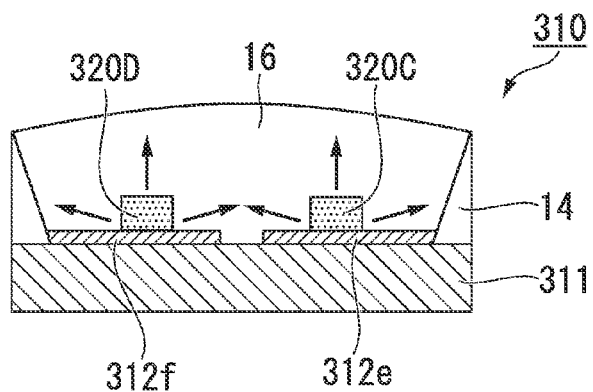

As shown in FIGS. 6A and 6B, a light emitting diode lamp 310 of the present embodiment is schematically configured such that five light emitting diodes 320A, 320B, 320C, 330A, and 330B are mounted on the surface of a mount substrate 311.

Figure 6C:
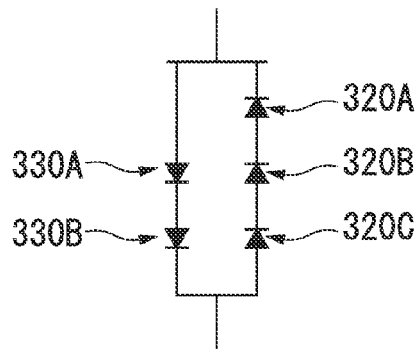

Here, the light emitting diode lamps 10 and 210 of the first and second embodiments are driven by a direct-current power supply. In contrast, the light emitting diode lamp 310 of the present embodiment is configured to be driven by an alternating-current power supply as shown in FIGS. 6A and 6C.

Specifically, as shown in FIG. 6A, a plurality of electrode terminals 312a to 312g is provided on the surface of the mount substrate 311. Moreover, the blue light emitting diode 330A, the red light emitting diodes 320B, 320A, and 320C, and the blue light emitting diode 330B are mounted on the electrode terminals 312b, 312c, 312d, 312e, and 212f, respectively. Moreover, the electrode terminal 312a is electrically connected to an electrode 313 that is provided on one end side of the mount substrate 311. Furthermore, the electrode terminal 312g is electrically connected to an electrode 314 that is provided on the other end side of the mount substrate 311.

In the light emitting diode lamp 310 of the present embodiment, the electrode terminal 312a is connected to a p-type ohmic electrode (not shown) of the red light emitting diode lamp 320A by a gold wire 315a. An n-type ohmic electrode of the red light emitting diode 320A is connected to the electrode terminal 312d by a gold wire 315b.

The electrode terminal 312d is connected to a p-type ohmic electrode of the red light emitting diode 320B by a gold wire 315c. An n-type ohmic electrode of the red light emitting diode 320B is connected to the electrode terminal 312c by a gold wire 315d.

The electrode terminal 312c is connected to a p-type ohmic electrode of the red light emitting diode 320C by a gold wire 315e. An n-type ohmic electrode of the red light emitting diode 320C is connected to the electrode terminal 312g by a gold wire 315f.

Moreover, in the light emitting diode lamp 310 of the present embodiment, the electrode terminal 312g is connected to a positive electrode (not shown) of the blue light emitting diode 330B by a gold wire 315g. A negative electrode of the blue light emitting diode 330B is connected to the electrode terminal 312f by a gold wire 315h.

The electrode terminal 312f is connected to a positive electrode of the blue light emitting diode 330A by a gold wire 315i. A negative electrode of the blue light emitting diode 330A is connected to the electrode terminal 312a by a gold wire j.

As above, in the light emitting diode lamp 310 of the present embodiment, three red light emitting diodes 320A, 320B, and 320C are electrically connected in series to each other and are lit when a positive voltage is applied to the electrode 313 and when a negative voltage is applied to the electrode 314.

Moreover, in the light emitting diode lamp 310 of the present embodiment, two blue light emitting diodes 330A and 330B are electrically in series to each other and are lit when a positive voltage is applied to the electrode 314 and a negative voltage is applied to the electrode 313, namely when an electric current flows in a direction reverse to when the red light emitting diodes are lit.

Although a light emitting diode generally consumes less power than other light sources even when it is driven by a direct-current power supply, it is possible to decrease a conversion loss from alternating-current to direct-current when the light emitting diode is driven by an alternating-current power supply. Moreover, in an illumination for plant growth, since photochemical reaction takes time, it is reported that pulsating irradiation provides more satisfactory reaction efficiency than continuous irradiation. Thus, driving with an alternating-current power supply in which light intensity changes in a short period of time has a great energy saving effect.

However, in the conventional mixed color light source (for example, the mixed color light source 110 shown in FIG. 10), there is a problem in that the circuit and wirings become complicated.

In contrast, according to the light emitting diode lamp 310 of the present embodiment, by mounting the red light emitting diode 320 and the blue light emitting diode 330 in the same package and wiring the same in opposite directions, it is possible to easily correspond to alternating-current driving.

<Fourth Embodiment>

Next, a fourth embodiment to which the present invention is applied will be described. In the present embodiment, a light emitting diode lamp has a different configuration from the light emitting diode lamp 310 of the third embodiment. Thus, with regard to the configuration of the light emitting diode lamp of the present embodiment, the same constituent portions as the light emitting diode lamp 310 of the third embodiment will be denoted by the same reference signs, and redundant description thereof will not be provided.

Figure 7A:
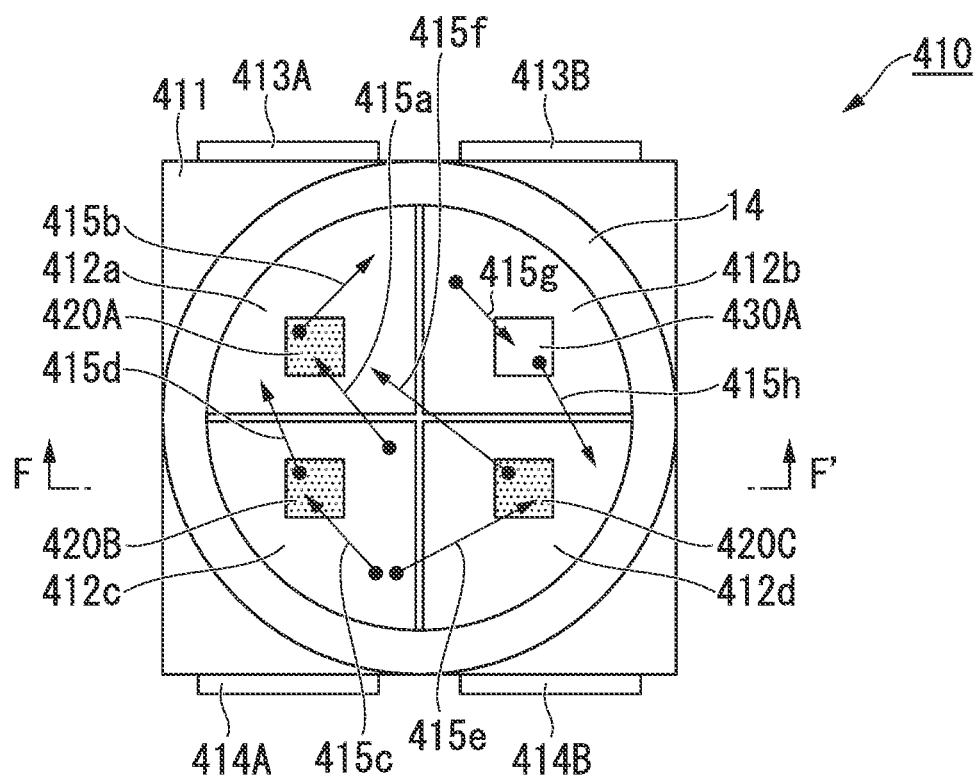
Figure 7B:
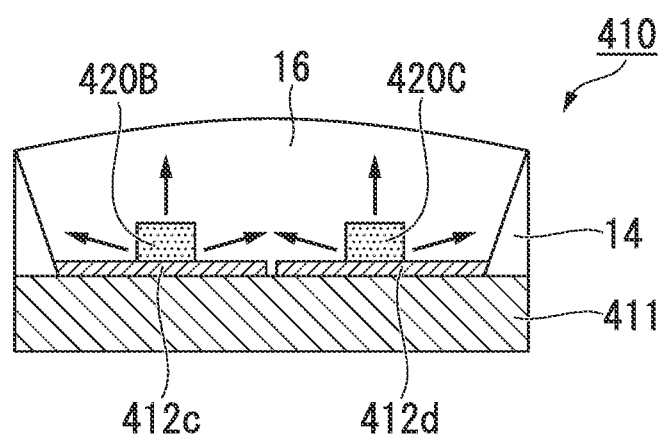

As shown in FIGS. 7A and 7B, a light emitting diode lamp 410 of the present embodiment is schematically configured such that four light emitting diodes 420A, 420B, 420C, and 430A are mounted on the surface of a mount substrate 411.

Here, in the light emitting diode lamp 310 of the third embodiment, the red and blue light emitting diodes each are connected in series to each other and driven by an alternating-current power supply. In contrast, in the light emitting diode lamp 410 of the present embodiment, as shown in FIG. 7A, all red light emitting diodes are connected in parallel to each other and are configured to be driven by an alternating-current power supply. When four terminals are connected to separate circuits, blue and red light emitting diodes can be controlled independently.

Specifically, as shown in FIG. 7A, four electrode terminals 412a to 412d are provided on the surface of the mount substrate 411. Moreover, a light emitting diode is mounted on each of the respective electrode terminals. That is, the red light emitting diode 420A, the blue light emitting diode 420A, and the red light emitting diodes 420B and 420C are mounted on the electrode terminals 412a, 412b, 412c, and 412d, respectively. Moreover, electrodes 413A and 413B are provided on one end side of the mount substrate 411, and the electrode terminals 412a and 412b are electrically connected to the electrodes 413A and 413B, respectively. Furthermore, electrodes 414A and 414B are provided on the other end side of the mount substrate 411, and the electrode terminals 414c and 414d are electrically connected to the electrodes 414A and 414B, respectively.

In the light emitting diode lamp 410 of the present embodiment, the electrode terminal 412c is connected to a p-type ohmic electrode (not shown) of the red light emitting diode 420A by a gold wire 415a. An n-type ohmic electrode of the red light emitting diode 420A is connected to the electrode terminal 412a by a gold wire 415b.

The electrode terminal 412c is connected to a p-type ohmic electrode of the red light emitting diode 420B by a gold wire 415c. An n-type ohmic electrode of the red light emitting diode 420B is connected to the electrode terminal 412a by a gold wire 415d.

The electrode terminal 412c is connected to a p-type ohmic electrode of the red light emitting diode 420C by a gold wire 415e. An n-type ohmic electrode of the red light emitting diode 420C is connected to the electrode terminal 412a by a gold wire 415f.

Moreover, in the light emitting diode lamp 410 of the present embodiment, the electrode terminal 412b is connected to a positive electrode (not shown) of the blue light emitting diode 430A by a gold wire 315g. A negative electrode of the blue light emitting diode 430A is connected to the electrode terminal 412d by a gold wire 415h.

As above, in the light emitting diode lamp 410 of the present embodiment, four light emitting diodes 420A, 420B, 420C, and 430A are electrically connected in parallel to each other. Thus, in the light emitting diode lamp 410, when a positive voltage is applied to the electrodes 413A and 413B, only the blue light emitting diode 430A is lit. In contrast, when a positive voltage is applied to the electrodes 414A and 414B, only the red light emitting diodes 420A, 420B, and 420C are lit.

According to the light emitting diode lamp 410 of the present embodiment, similarly to the light emitting diode lamp 310 of the third embodiment, it is possible to save energy by alternating-current driving and pulse driving. Moreover, since the respective light emitting diodes are connected independently, it is possible to attain high brightness.

<Fifth Embodiment>

Next, a fifth embodiment to which the present invention is applied will be described. In the present embodiment, a light emitting diode lamp has a different configuration from the light emitting diode lamps of the first to fourth embodiments. Thus, with regard to the configuration of the light emitting diode lamp of the present embodiment, the same constituent portions as the light emitting diode lamps of the first to fourth embodiments will be denoted by the same reference signs, and a redundant description thereof will not be provided here.

Figure 8:
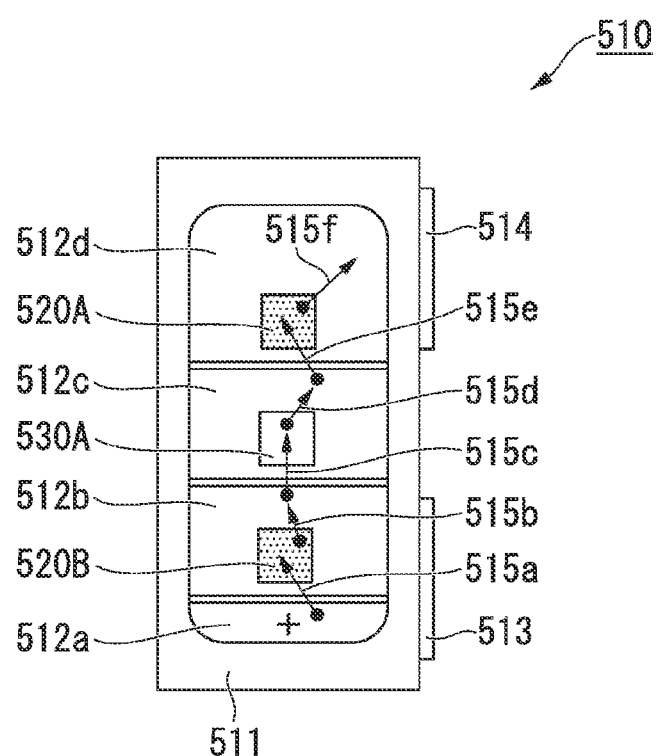
FIG. 8 is a plan view for explaining a light emitting diode lamp according to a fifth embodiment of the present invention.

As shown in FIG. 8, a light emitting diode lamp 510 of the present embodiment is schematically configured such that three light emitting diodes 520A, 520B, and 530A are mounted on the surface of a mount substrate 511.

Here, in the light emitting diode lamps of the second to fourth embodiments, a pair of electrodes is provided to confront each other with a mount substrate disposed therebetween. In contrast, in the light emitting diode lamp 510 of the present embodiment, as shown in FIG. 8, a pair of electrodes 513 and 514 is provided to be arranged on an optional one end side of the mount substrate 511.

Specifically, as shown in FIG. 8, four electrode terminals 512a to 512d are provided on the surface of the mount substrate 511. Moreover, the red light emitting diode 520A, the blue light emitting diode 530A, and the red light emitting diode 520B are mounted on the electrode terminals 512b, 512c, and 512d, respectively. Moreover, a positive electrode 513 and a negative electrode 514 are provided on one end side of the mount substrate 511. The electrode terminals 512a and 512d are electrically connected to the positive electrode 513 and the negative electrode 514, respectively.

In the light emitting diode lamp 510 of the present embodiment, the electrode terminal 512a is connected to a p-type ohmic electrode (not shown) of the red light emitting diode 520A by a gold wire 515a. A n-type ohmic electrode of the red light emitting diode 520A is connected to the electrode terminal 512b by a gold wire 515b.

The electrode terminal 512b is connected to a positive electrode of the blue light emitting diode 530A by a gold wire 515*c*. A negative electrode of the blue light emitting diode 530A is connected to the electrode terminal 512*c* by a gold wire 515*d*.

The electrode terminal 512*c* is connected to a p-type ohmic electrode of the red light emitting diode 520B by a gold wire 515*e*. An n-type ohmic electrode of the red light emitting diode 520B is connected to the electrode terminal 512*d* by a gold wire 515*f*.

As above, in the light emitting diode lamp 510 of the present embodiment, three light emitting diodes 520A, 520B, and 530A are electrically connected in series to each other. Thus, in the light emitting diode lamp 510, when a positive voltage is applied to the positive electrode 513, all of the light emitting diodes 520A, 520B, and 530A are lit.

According to the light emitting diode lamp 510 of the present embodiment, since a pair of electrodes 513 and 514 is provided to be arranged on an optional one end side of the mount substrate 511, the light emitting diode lamp 510 can be ideally used for a sideview-type (edge-type) backlight like the illumination apparatus 40 having the configuration as shown in FIG. 4.

<Sixth Embodiment>

Next, a sixth embodiment to which the present invention is applied will be described. In the present embodiment, a light emitting diode lamp has a different configuration from the light emitting diode lamp of the fifth embodiment. Thus, with regard to the configuration of the light emitting diode lamp of the present embodiment, the same constitutent portions as the light emitting diode lamp of the fifth embodiment will be denoted by the same reference signs, and a redundant description thereof will not be provided here.

Figure 9:
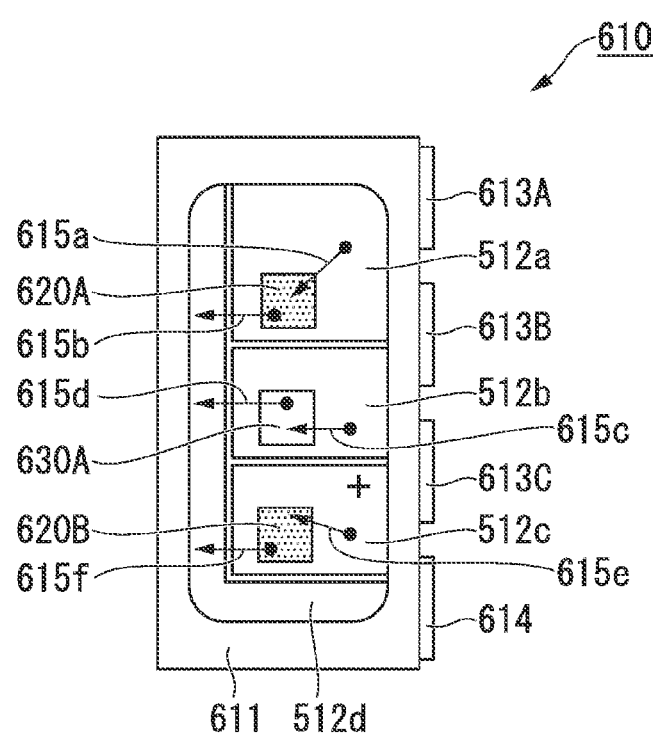
FIG. 9 is a plan view for explaining a light emitting diode lamp according to a sixth embodiment of the present invention.

As shown in FIG. 9, a light emitting diode lamp 610 of the present embodiment is schematically configured such that three light emitting diodes 620A, 620B, and 630A are mounted on the surface of a mount substrate 611.

Here, in the light emitting diode lamp 510 of the fifth embodiment, three light emitting diodes 520A, 520B, and 530A are electrically connected in series to each other. In contrast, in the light emitting diode lamp 610 of the present embodiment, as shown in FIG. 9, three light emitting diodes 620A, 620B, and 630A are electrically connected in parallel to each other (independently).

Specifically, as shown in FIG. 9, four electrode terminals 612*a* to 612*d* are provided on the surface of the mount substrate 611. Moreover, the red light emitting diode 620A, the blue light emitting diode 620A, and the red light emitting diode 620B are mounted on the electrode terminals 612*a*, 612*b*, and 612*c*, respectively. Moreover, three positive electrodes 613A to 613C and a negative electrode 614 are provided on one end side of the mount substrate 611. The electrode terminals 612*a*, 612*b*, 612*c*, and 612*d* are electrically connected to the positive electrodes 613A, 613B, and 613C and the negative electrode 614, respectively.

In the light emitting diode lamp 610 of the present embodiment, the electrode terminal 612*a* is connected to a p-type ohmic electrode (not shown) of the red light emitting diode 620A by a gold wire 615*a*. An n-type ohmic electrode of the red light emitting diode 620A is connected to the electrode terminal 612*d* by a gold wire 615*b*.

The electrode terminal 612*b* is connected to a positive electrode of the blue light emitting diode 630A by a gold wire 615*c*. A negative electrode of the blue light emitting diode 630A is connected to the electrode terminal 612*d* by a gold wire 615*d*.

The electrode terminal 612*c* is connected to a p-type ohmic electrode of the red light emitting diode 620B by a gold wire 615*e*. An n-type ohmic electrode of the red light emitting diode 620B is connected to the electrode terminal 612*d* by a gold wire 615*f*.

As above, in the light emitting diode lamp 610 of the present embodiment, three light emitting diodes 620A, 620B, and 630A are electrically connected in parallel to each other (independently). Thus, in the light emitting diode lamp 610, when a positive voltage is applied to the positive electrodes 613A to 613C, all of the light emitting diodes 620A, 620B, and 630A are lit.

According to the light emitting diode lamp 610 of the present embodiment, since the electrodes 613A to 613C and the electrode 614 are provided to be arranged on an optional one end side of the mount substrate 611, similarly to the light emitting diode lamp 510 of the fifth embodiment, the light emitting diode lamp 610 can be ideally used for a sideview-type (edge-type) backlight. Moreover, since the respective light emitting diodes 620A, 620B, and 630A are connected independently (in parallel to each other), it is possible to increase the brightness of the respective light emitting diodes 620A, 620B, and 630A.

EXAMPLES

Hereinafter, the effects of the present invention will be described in detail with reference to examples. The present invention is not limited to these examples.

In the present example, an example of manufacturing the multicolor light emitting diode lamp and the illumination apparatus for plant growth according to the present invention will be described in detail. Moreover, a light emitting diode manufactured in the present example includes a red light emitting diode including an AlGaInP-based light emitting section and a blue light emitting diode including a GaN-based light emitting section.

Example 1

The light emitting diode lamp shown in FIGS. 1A and 1B was manufactured using a light emitting diode chip of the embodiment, and the optical properties such as a photon flux [$\mu mol \cdot s^{-1}$] were evaluated.

FIGS. 1A and 1B are diagrams illustrating an example of the configuration of a light emitting element package. In the light emitting element package, two red light emitting diode chips (20A and 20B) shown in FIGS. 2A and 2B and one blue light emitting diode chip (30A) shown in FIG. 3 are mounted. The package 10 has a size of about 3.5 mm by 2.8 mm and a thickness of 1.8 mm. The red light emitting diode chip includes an AlGaInP-based light emitting layer attached to a GaP substrate and has a peak wavelength of 660 nm. The blue light emitting diode chip includes an InGaN-based light emitting layer grown on a sapphire substrate and emits light at a wavelength of 450 nm.

The package 10 includes three chips 20A, 20B, and 30A which are mounted on a mounting portion (metal) in a resin container in which a concave portion is formed in an opening portion formed in a planar shape.

Six lead terminals (not shown) were formed on the side surfaces of the resin container. As a result, the respective light emitting diodes can be lit independently. The lead terminals were connected to the mounting portion. The container portion was formed by injection molding a thermoplastic resin (in the following description, referred to as a white resin) containing a white pigment having high reflectivity.

A material having sufficient heat resistance was selected for the white resin in order to correspond to processes involving heat such as a solder reflow process. As a base resin, polyphthalamide (PPA) was used.

The light emitted from the light emitting diode chip was focused at a half-value angle of 30° by a wall surface standing on the concave portion provided in the resin container.

The semiconductor light emitting element chips 20A, 20B, and 30A were fixed to the mounting portion by a die-bonding agent made from a silicon resin. In this case, the chip interval was about 0.5 mm.

Moreover, in the light emitting element package 10, as shown in FIG. 1A, the respective electrodes and the respective terminal portions of the light emitting diode chip were connected by bonding wires 15.

Here, the mounting portion was a metal board having a thickness of about 0.4 mm, which was formed of a metal such as a copper alloy, and in which silver plating was performed on the surface to increase reflectivity. That is, the mounting portion was formed of a metal having excellent heat conducting properties and reflectivity.

The package was sealed by a transparent silicon resin so as to bury the concave portion, whereby a lamp for plant growth was manufactured.

The photon flux was measured by collecting light extracted from the lamp when an electric current of 20 mA was flowed to three chips. The red photon flux (peak wavelength=660 nm) was 0.177 [$\mu mol \cdot s^{-1}$], and the blue photon flux (peak wavelength=450 nm) was 0.065 [$\mu mol \cdot s^{-1}$]. The ratio of R (red) to B (blue) was about 2.7.

Example 2

The sideview-type light emitting diode lamp shown in FIG. 8 was manufactured using a vertical conduction-type light emitting diode chip unlike Example 1, and the photon flux [$\mu mol \cdot s^{-1}$] was evaluated.

The red light emitting diode chip had a known substrate-attached reflecting structure. The chip used had a structure in which a silicon substrate having a metal reflecting layer of a silver alloy is attached to an epitaxial layer including an AlGaInP-based light emitting layer having a thickness of 660 nm. The chip had electrodes on its upper surface and rear surface (silicon substrate) (not shown).

On the other hand, as the blue light emitting diode chip, an element having a structure in which an InGaN-based light emitting layer having a thickness of 450 nm was epitaxially grown on a known n-type SiC substrate was used. The chip had a vertical conduction-type structure which had electrodes on its upper surface and rear surface (SiC substrate). The material of the package and the metal material of the mounting portion were the same as those of Example 1, but the package had the same shape as that shown in FIG. 8 such that three chips were mounted in series to each other. The package had a size of 3 by 1.4 mm and a thickness of 0.8 mm.

The light emitting element chips were fixed to the mounting portion by a die-bonding agent made from a silver paste which is a conductive adhesive, and the rear surface electrodes were electrically connected to the mounting portion. In this case, the chip intervals was about 0.4 mm.

Moreover, in the light emitting element package 510, red and blue chips were disposed as shown in FIG. 8. The surface electrodes and the respective terminal portions of the light emitting diode chip were connected by bonding wires 515. Since the surface electrodes of the red chip were n-type electrodes and the surface electrodes of the blue chip were p-type electrodes, the three chips were wired in series taking the polarities into consideration.

Here, the mounting portion was a metal board having a thickness of about 0.4 mm, which was formed of a metal such as a copper alloy, and in which silver plating was performed on the surface to increase reflectivity. That is, the mounting portion was formed of a metal having excellent heat conducting properties and reflectivity.

The package was sealed by a transparent silicon resin so as to bury the concave portion, whereby a lamp for plant growth was manufactured.

The photon flux was measured by collecting light extracted from the lamp when an electric current of 20 mA was flowed to three chips. The red photon flux (peak wavelength=660 nm) was 0.13 [$\mu mol \cdot s^{-1}$], and the blue photon flux (peak wavelength=450 nm) was 0.062 [$\mu mol \cdot s^{-1}$]. The ratio of R (red) to B (blue) was about 2.1.

Example 3

A small-size illumination panel for plant growth was manufactured using the light emitting diode lamp (half-value angle: 30°) shown in FIGS. 1A and 1B, and the optical properties including the photon flux [$\mu mol \cdot s^{-1}$] and the uniformity of mixed color were evaluated.

In the illumination panel, lamps in which two red LEDs and one blue LED were mounted on the same package were fixed at the same positions as the positions of the lamps shown in FIG. 10 by soldering.

The panel had a size of 12 cm square, the lamp interval was 4 cm, and nine lamps were disposed at the positions separated by 2 cm from the ends of the panel.

Moreover, an electric current of 20 mA was flowed to the three LEDs of the lamp, and the optical properties at a position of 20 cm below the panel for plant growth, namely the photon flux density and the uniformity of mixed color were evaluated.

In addition, the photon flux was measured by collecting light extracted from one lamp when an electric current of 20 mA was flowed to the respective LEDs. The red photon flux was 0.177 [$\mu mol \cdot s^{-1}$], and the blue photon flux was 0.065 [$\mu mol \cdot s^{-1}$]. The ratio of R to B was about 2.7. When one LED was used for each color, the ratio of R to B was about 1.35.

Moreover, the uniformity of mixed color of the illumination panel was evaluated by comparing the photon flux densities at two points of the panel center C(0,0) of a plane separated by 20 cm from the panel and a position A(3,3) separated by 3 cm in the X and Y directions from the center. The measurement results are shown in Table 1.

In this case, the input power was 1.26 W.

Example 4

An edge-type small-size illumination panel for plant growth was manufactured using the light emitting diode lamp (half-value angle: 30°) shown in FIG. 8, and the optical properties including the photon flux [$\mu mol \cdot s^{-1}$] and the uniformity of mixed color were evaluated.

In the illumination panel, lamps in which two red LEDs and one blue LED were mounted on the same package were fixed at the same positions as the positions of the lamps shown in FIG. 4 by soldering.

The photon flux was measured by collecting light extracted from one lamp when an electric current of 20 mA was flowed to the respective LEDs. The red photon flux was 0.195 [μmol·s⁻¹], and the blue photon flux was 0.072 [μmol·s⁻¹]. The ratio of R to B was about 2.7. When one LED was used for each color, the ratio of R to B was about 1.35.

The panel had a size of 12 cm square, the lamp interval was 2 cm, and five lamps were disposed at the positions separated by 2 cm from the ends of the panel.

Taking the number of lamps mounted into consideration, an electric current of 36 mA was flowed to the respective LEDs, and the optical properties at a position of 20 cm below the panel for plant growth were evaluated. The measurement results are shown in Table 1.

In this case, the input power was 1.37 W.

Comparative Example 1

A shell-shaped (φ: 5 mm) blue lamp (half-value angle: 30°) was disposed at the panel center, and eight red lamps having a half-value angle of 15° were disposed around the blue lamp. Here, the red LED was a LED having the conventional AlGaAs-based light emitting layer.

The panel had a size of 6 cm square, the lamp interval was 2 cm, and the lamps were disposed at the positions separated by 1 cm from the ends of the panel. Four panels of 6 cm square were joined together to manufacture a small-size illumination panel of 12 cm square.

Moreover, an electric current of 40 mA was flowed to the respective LEDs of four blue LEDs and thirty two red LEDs, and the optical properties at a position of 20 cm below the panel for plant growth were evaluated. The measurement results are shown in Table 1.

In this case, the input power was 3.35 W.

Moreover, it was proven that the illumination apparatus of the present invention requires less power and achieves energy savings compared to the comparative example.

INDUSTRIAL APPLICABILITY

The light emitting diode lamp and the illumination apparatus of the present invention can be used as a light source for plant growth, in particular.

REFERENCE SIGNS LIST

10: LIGHT EMITTING DIODE LAMP (MULTICOLOR LIGHT EMITTING DIODE LAMP FOR PLANT GROWTH)
11: MOUNT SUBSTRATE
12: n-ELECTRODE TERMINAL
13: p-ELECTRODE TERMINAL
14: REFLECTING WALL
15: GOLD WIRE
16: SEALING MATERIAL
20: RED LIGHT EMITTING DIODE (FIRST LIGHT EMITTING DIODE)
21: COMPOUND SEMICONDUCTOR LAYER
22: FUNCTIONAL SUBSTRATE
23: n-TYPE OHMIC ELECTRODE
24: p-TYPE OHMIC ELECTRODE
25: LIGHT EMITTING SECTION
25A: LOWER CLADDING LAYER
25B: LIGHT EMITTING LAYER
25C: UPPER CLADDING LAYER
26: CURRENT DIFFUSION LAYER

TABLE 1

|  | Point A (3, 3) | | | | Central point C (0, 0) | | | |
| --- | --- | --- | --- | --- | --- | --- | --- | --- |
|  | Total photon flux density | R: Photon flux density | B: Photon flux density | R/B ratio | Total photon flux density | R: Photon flux density | B: Photon flux density | R/B ratio |
| Example 3 | 153 | 110 | 42 | 2.6 | 172 | 124 | 48 | 2.6 |
| Example 4 | 168 | 123 | 45 | 2.7 | 159 | 117 | 43 | 2.7 |
| Comparative Example 1 | 136 | 98 | 38 | 2.6 | 129 | 108 | 30 | 3.6 |

Total photon flux density: photon flux density (unit: μmol/s·m²) when red and blue lamps were lit
R: photon flux density when red lamp was lit
B: photon flux density when blue lamp was lit As shown in Table 1, in contrast to the illumination panel of Comparative Example 1, in the illumination panels of Examples 3 and 4, it was confirmed that as the result of the comparison between the photon flux densities at the central position, point C, of the irradiation area of the illumination panel and the point A separated from the central position, the red-to-blue ratio (R/B ratio) of the photon flux density was uniform.

Specifically, in the illumination panel of Comparative Example 1, it was confirmed that the R/B ratio at the central position of the irradiation area was 3.6, whereas the R/B ratio at the point A separated from the central position was 2.6, and the uniformity of the mixed color within the irradiation surface of the illumination panel was low.

In contrast, in the illumination panels of Examples 3 and 4, it was confirmed that the R/B ratio at the central position of the irradiation area was the same as the R/B ratio at the point A separated from the central position, and the uniformity of mixed color was high.

27: CONNECTION LAYER
30: BLUE LIGHT EMITTING DIODE (SECOND LIGHT EMITTING DIODE)
31: SUBSTRATE
32: n-TYPE SEMICONDUCTOR LAYER
33: LIGHT EMITTING LAYER
34: p-TYPE SEMICONDUCTOR LAYER
35: SEMICONDUCTOR LAYER
36: POSITIVE ELECTRODE
37: NEGATIVE ELECTRODE
38: CONNECTION LAYER
40: ILLUMINATION APPARATUS (ILLUMINATION APPARATUS FOR PLANT GROWTH)
41: LIGHT GUIDE PANEL
41a: LIGHT EXTRACTION SURFACE
41b: SIDE SURFACE

The invention claimed is:

1. A multicolor light emitting diode lamp for plant growth comprising:
two first light emitting diodes, each including a pn-junction type light emitting section having a light emitting layer which has a composition formula, $(Al_XGa_{1-X})_YIn_{1-Y}P$ ($0 \leq X \leq 0.1$ and $0 < Y \leq 1$), and in which a peak luminescence wavelength is not less than 655 nm and not more than 675 nm, and each of which emits red light; and one second light emitting diode including a light emitting layer which has a composition formula, $GaXIn1-XN$ ($0 \leq X \leq 1$) and in which a peak luminescence wavelength is not less than 420 nm and not more than 470 nm, and which emits blue light, wherein the two first light emitting diodes and the one second light emitting diode are mounted on a surface of a substrate sealed in a same package, the two first light emitting diodes and the one second light emitting diode are directly electrically connected in series to one another, or the one second light emitting diode is directly electrically connected in parallel to the two first light emitting diodes which are directly electrically connected in series to one another, a photon flux R [μmol·s−1] of the two first light emitting diodes and a photon flux B [μmol·s−1] of the one second light emitting diode mounted on the multicolor light emitting diode lamp satisfy a relation of R>B per a same amount of an electric current simultaneously flowing through the two first light emitting diodes and the one second light emitting diode, and, and a distance between two adjacent light emitting diodes of the first and second light emitting diodes is within 10 mm.

2. An illumination apparatus for plant growth comprising:
two or more of the multicolor light emitting diode lamps for plant growth according to claim 1,
wherein the multicolor light emitting diode lamps for plant growth are disposed at approximately equal intervals and configured to be independently controllable.

3. The illumination apparatus for plant growth according to claim 2, wherein the number of multicolor light emitting diode lamps for plant growth is controllable in accordance with a growth area of plants.

4. The illumination apparatus for plant growth according to claim 2, wherein a photon flux of the multicolor light emitting diode lamp for plant growth is controllable in accordance with the distance between the light emitting diode lamp and plants.

5. The illumination apparatus for plant growth according to claim 2, wherein an electric current applied to the multicolor light emitting diode lamp for plant growth is pulse-driven, and
wherein a lighting time of the multicolor light emitting diode lamp for plant growth is controllable in accordance with the growth state of the plants.

6. The illumination apparatus for plant growth according to claim 2, further comprising:
a light guide panel having a light extraction surface,
wherein light of the multicolor light emitting diode lamp for plant growth taken from a side surface of the light guide panel is extractable from the light extraction surface.

7. A plant growth method of controlling a combination of one or more of the number of the multicolor light emitting diode lamps for plant growth which are lit, a photon flux, an applied electric current, and the pulse driving time of the illumination apparatus for plant growth according to claim 2, based on a growth state of plants.

8. The multicolor light emitting diode lamp for plant growth according to claim 1, wherein the two first light admitting diodes and the one second light emitting diode are electronically connected in series to one another in a single string.

9. The multicolor light emitting diode lamp for plant growth according to claim 1, wherein the two first light emitting diodes are connected in series to one another and in parallel to the one second light emitting diode,
a cathode of the one second light emitting diode is connected to an anode of one of the two first light emitting diodes, and
an anode of the one second light emitting diode is connected to a cathode of another one of the two first light emitting diodes.

10. The multicolor light emitting diode lamp for plant growth according to claim 1, wherein a reflecting wall is disposed at a boundary of the substrate, the reflecting wall surrounding the two first light emitting diodes and the one second light emitting diode, and
a sealing material fills a space above the surface of the substrate and inner side of the reflecting wall to seal the two first light emitting diodes and the one second light emitting diode in the same package.

* * * * *